United States Patent
Hiraka

(10) Patent No.: US 10,466,533 B2
(45) Date of Patent: Nov. 5, 2019

(54) LIGHT FLUX CONTROL MEMBER, LIGHT-EMITTING DEVICE, SURFACE LIGHT SOURCE DEVICE AND DISPLAY DEVICE

(71) Applicant: Enplas Corporation, Saitama (JP)

(72) Inventor: Kensuke Hiraka, Saitama (JP)

(73) Assignee: Enplas Corporation, Saitama (JP)

( * ) Notice: Subject to any disclaimer, the term of this patent is extended or adjusted under 35 U.S.C. 154(b) by 18 days.

(21) Appl. No.: 15/765,520

(22) PCT Filed: Oct. 3, 2016

(86) PCT No.: PCT/JP2016/079271
§ 371 (c)(1),
(2) Date: Apr. 3, 2018

(87) PCT Pub. No.: WO2017/061370
PCT Pub. Date: Apr. 13, 2017

(65) Prior Publication Data
US 2019/0033660 A1    Jan. 31, 2019

(30) Foreign Application Priority Data

Oct. 7, 2015 (JP) .................. 2015-199452
Aug. 30, 2016 (JP) .................. 2016-168310

(51) Int. Cl.
*F21V 5/00* (2018.01)
*F21V 5/04* (2006.01)
(Continued)

(52) U.S. Cl.
CPC .......... *G02F 1/133606* (2013.01); *F21S 2/00* (2013.01); *F21V 5/00* (2013.01);
(Continued)

(58) Field of Classification Search
CPC ............ F21V 5/04; F21V 5/048; F21V 19/001
(Continued)

(56) References Cited

U.S. PATENT DOCUMENTS 7,352,011 B2 * 4/2008 Smits ................. G02B 19/0066
                                                               257/100
9,410,672 B2 * 8/2016 Chen ....................... F21V 5/048
(Continued)

FOREIGN PATENT DOCUMENTS

JP       200944016 A    2/2009
JP      2009542017 A   11/2009
(Continued)

OTHER PUBLICATIONS

International Search Report from International Application No. PCT/JP2016/079271 dated Dec. 20, 2016.

*Primary Examiner* — William J Carter
(74) *Attorney, Agent, or Firm* — Brundidge & Stanger, P.C.

(57) ABSTRACT

This light flux control member has an incidence surface and an emission surface. The emission surface includes a first emission surface projecting toward the back side and disposed so as to cross the central axis, and a second emission surface projecting toward the front side and disposed so as to surround the first emission surface. When the light-emitting element is disposed so as to face the recessed part such that a light emission center thereof is located on the central axis, and a surface to be irradiated is disposed above the emission surface so as to lie at right angles to the central axis, a second maximum value calculated by a predetermined expression is larger than a first maximum value calculated by a predetermined expression.

8 Claims, 17 Drawing Sheets

(51) Int. Cl.
*G02F 1/1335* (2006.01)
*F21S 2/00* (2016.01)
*G02B 19/00* (2006.01)
*H01L 33/58* (2010.01)
*G02B 5/02* (2006.01)
*H01L 25/075* (2006.01)

(52) U.S. Cl.
CPC ............ *F21V 5/04* (2013.01); *G02B 19/0014* (2013.01); *G02B 19/0061* (2013.01); *G02F 1/133603* (2013.01); *G02B 5/021* (2013.01); *G02B 5/0242* (2013.01); *G02F 2001/133607* (2013.01); *H01L 25/0753* (2013.01); *H01L 33/58* (2013.01)

(58) Field of Classification Search
USPC ................................. 362/309, 335, 336, 338
See application file for complete search history.

(56) References Cited

U.S. PATENT DOCUMENTS

| | | | | |
|---|---|---|---|---|
| 2006/0066218 | A1* | 3/2006 | Yamaguchi | G02B 3/04 313/498 |
| 2007/0029563 | A1* | 2/2007 | Amano | F21S 41/14 257/98 |
| 2008/0007966 | A1* | 1/2008 | Ohkawa | G02B 5/045 362/608 |
| 2008/0013322 | A1* | 1/2008 | Ohkawa | G02B 27/0955 362/311.06 |
| 2008/0297020 | A1* | 12/2008 | Wanninger | G02B 27/0927 313/110 |
| 2009/0213469 | A1* | 8/2009 | Braune | G02B 7/022 359/642 |
| 2010/0073907 | A1* | 3/2010 | Wanninger | G02B 3/04 362/311.01 |
| 2010/0259706 | A1* | 10/2010 | Kuwaharada | F21V 5/04 362/311.09 |
| 2010/0277672 | A1* | 11/2010 | Matsuki | G02B 19/0014 362/235 |
| 2011/0249451 | A1* | 10/2011 | Fujii | F21V 5/04 362/317 |
| 2014/0032806 | A1 | 11/2014 | Katsumoto | |

FOREIGN PATENT DOCUMENTS

| | | |
|---|---|---|
| JP | 2011221190 A | 11/2011 |
| WO | 2009/157166 A1 | 12/2009 |
| WO | 2013094599 A | 6/2013 |

\* cited by examiner

LIGHT FLUX CONTROL MEMBER, LIGHT-EMITTING DEVICE, SURFACE LIGHT SOURCE DEVICE AND DISPLAY DEVICE

TECHNICAL FIELD

The present invention relates to a light flux controlling member configured to control distribution of light emitted from a light emitting element, and a light emitting device, a surface light source device and a display apparatus which include the light flux controlling member.

BACKGROUND ART

In recent years, for the purpose of energy saving and downsizing, light emitting diodes (hereinafter also referred to as "LEDs") are used as light sources for lighting. Light emitting devices each having a combination of an LED and a light flux controlling member for controlling distribution of light emitted from the LED are used in place of, for example, fluorescent lighting and halogen lamps. Further, direct surface light source devices incorporating the light emitting devices in a lattice shape are used as a backlight in transmission type image display devices, such as liquid crystal display apparatuses (refer to, for example, PTL 1).

FIGS. 1A to 1C illustrate a configuration of surface light source device 10 disclosed in PTL 1. FIG. 1A is a schematic plan view of surface light source device 10, FIG. 1B is a plan view of light emitting device 30 in surface light source device 10, and FIG. 1C is a cross-sectional view taken along line A-A of FIG. 1B. In FIG. 1A, a broken line schematically illustrates a range irradiated with light emitted from light emitting device 30.

As illustrated in FIGS. 1A to 1C, surface light source device 10 disclosed in PTL 1 includes printed wiring substrate 20 and a plurality of light emitting devices 30 disposed on printed wiring substrate 20 in a rectangular lattice shape. Each of light emitting devices 30 includes light emitting element 35 and a light guide member (light flux controlling member) 40 disposed so as to cover light emitting element 35.

Light guide member 40 includes substantially hemisphere-shaped lens 41 and flange 42 surrounding lens 41. Lens 41 includes incidence surface 44, namely the inner surface of recess 43 disposed on the rear side, and emission surface 45 disposed on the front side. Emission surface 45 includes two flat surfaces 46 parallel to central axis CA and to each other, and curved surface 47 protruding upward and disposed between two flat surfaces 46. In surface light source device 10 disclosed in PTL 1, light guide member 40 controls light emitted from light emitting element 35 so that the light expands more in a direction, where the distance between light emitting devices 30 is longer (long side direction in the rectangular lattice; X-direction), than in a direction, where the distance between light emitting devices 30 is shorter (short side direction in the rectangular lattice; Y-direction). This enables uniform irradiation of a surface to be irradiated in the surface light source device disclosed in PTL 1 even in a case where light emitting devices 30 are disposed in a rectangular lattice shape.

CITATION LIST

Patent Literature

PTL 1
WO2009/157166

SUMMARY OF INVENTION

Technical Problem

In surface light source device 10 disclosed in PTL 1, light emitted from flat surface 46 is controlled to become concentrated. Light emitted from curved surface 47, meanwhile, is controlled to become expanded. The light emitted from flat surface 46 and the light emitted from curved surface 47 are thus more likely to intersect each other on the optical paths thereof to the surface to be irradiated. This may cause generation of a bright part on the surface to be irradiated.

An object of the present invention is to provide a light flux controlling member capable of suppressing the generation of a bright part on the surface to be irradiated even when light emitting devices are disposed in a lattice shape. Another object of the present invention is to provide a light emitting device, a surface light source device and a display apparatus which include the light flux controlling member.

Solution to Problem

A light flux controlling member according to the present invention is configured to control a distribution of light emitted from a light emitting element, the light flux controlling member including: an incidence surface which is an inner surface of a recess formed on a rear side of the light flux controlling member so as to intersect a central axis of the light flux controlling member; and an emission surface disposed on a side opposite to the incidence surface, in which the emission surface includes a first emission surface protruding toward the rear side of the light flux controlling member, and a second emission surface protruding toward a front side of the light flux controlling member, the first emission surface being disposed so as to intersect the central axis of the light flux controlling member, and the second emission surface being disposed so as to surround the first emission surface; in which when the light emitting element is disposed so that a light emitting center thereof is positioned on the central axis and the light emitting element faces the recess, and when a surface to be irradiated is disposed above the emission surface so as to be orthogonal to the central axis, a second maximum value is larger than a first maximum value.

The first maximum value is determined by:

(1) in a first cross section which includes the central axis of the light flux controlling member and a point closest to the central axis, the point closest to the central axis being in an outer edge of the emission surface, obtaining a first polynomial approximation function indicating a relation between a light emission angle $\theta1A$ and a light output angle $\theta3A$, in which the light emission angle $\theta1A$ is an angle, relative to the central axis, of a traveling direction of an arbitrary light beam between the light emitting center and the incidence surface, the arbitrary light beam being emitted from the light emitting center, and the light output angle $\theta3A$ is an angle of the traveling direction of the arbitrary light beam relative to the central axis between the emission surface and the surface to be irradiated, (2) obtaining a first curve corresponding to first-order differentiation of the first polynomial approximation function, and (3) determining the first maximum value which is a maximum value in the first curve in a case where the light emission angle θ1A is more than 40°; and the second maximum value is determined by:

(1) in a second cross section which includes the central axis of the light flux controlling member and a point farthest from the central axis, the point farthest from the central axis being in the outer edge of the emission surface, obtaining a second polynomial approximation function indicating a relation between a light emission angle θ1B and a light output angle θ3B, in which the light emission angle θ1B is an angle, relative to the central axis, of a traveling direction of an arbitrary light beam between the light emitting center and the incidence surface, the arbitrary light beam being emitted from the light emitting center, and the light output angle θ3B is an angle of the traveling direction of the arbitrary light beam relative to the central axis between the emission surface and the surface to be irradiated, (2) obtaining a second curve corresponding to first-order differentiation of the second polynomial approximation function, and (3) determining the second maximum value which is a maximum value in the second curve in a case where the light emission angle θ1B is more than 40°.

The light flux controlling member according to the present invention is configured to control a distribution of light emitted from a light emitting element, the light flux controlling member including: an incidence surface which is an inner surface of a recess formed on a rear side of the light flux controlling member so as to intersect a central axis of the light flux controlling member; and an emission surface disposed on a side opposite to the incidence surface, in which the emission surface includes a first emission surface protruding toward the rear side of the light flux controlling member, and a second emission surface protruding toward a front side of the light flux controlling member, the first emission surface being disposed so as to intersect the central axis, and the second emission surface being disposed so as to surround the first emission surface; and in which when the light emitting element is disposed so that a light emitting center thereof is positioned on the central axis and the light emitting element faces the recess, and when a surface to be irradiated is disposed above the emission surface so as to be orthogonal to the central axis, formula (2) below is satisfied.

$$D1 < D2 < D1 \times \sqrt{2} \qquad \text{Formula (2)}$$

In the formula (2), D1 is a first reaching distance determined by formula (3) below, the first reaching distance being, in a first cross section which includes the central axis and a point closest to the central axis, the point closest to the central axis being in an outer edge of the emission surface, a distance from the central axis to a first reaching point of a first light beam emitted from the light emitting center at a first light emission angle, the first reaching point being on the surface to be irradiated; and D2 is a second reaching distance determined by formula (4) below, the second reaching distance being, in a second cross section which includes the central axis and a point farthest from the central axis, the point farthest from the central axis being in the outer edge of the emission surface, a distance from the central axis to a second reaching point of a second light beam emitted from the light emitting center of the light emitting element at a second light emission angle, the second reaching point being on the surface to be irradiated.

$$D1 = h1a \tan θ1a + h2a \tan θ2a + h3a \tan θ3a \qquad \text{Formula (3)}$$

In the formula (3), $h1a$ is a distance in the first cross section from the light emitting center to a first incidence position that is an incidence point of the first light beam on the incidence surface, the distance being in a direction along the central axis; $h2a$ is a distance in the first cross section from the first incidence position to a first emission position that is an emission point of the first light beam on the emission surface, the distance being in the direction along the central axis; $h3a$ is a distance in the first cross section from the first emission position to a first position to be irradiated that is the first reaching point of the first light beam on the surface to be irradiated, the distance being in the direction along the central axis; $θ1a$ is the first light emission angle that is, in the first cross section, an angle of a traveling direction of the first light beam relative to the central axis between the light emitting center and the incidence surface; $θ2a$ is, in the first cross section, an angle of the traveling direction of the first light beam relative to the central axis between the incidence surface and the emission surface; and $θ3a$ is, in the first cross section, an angle of the traveling direction of the first light beam relative to the central axis between the emission surface and the surface to be irradiated.

$$D2 = h1b \tan θ1b + h2b \tan θ2b + h3b \tan θ3b \qquad \text{Formula (4)}$$

In formula (4), $h1b$ is a distance in the second cross section from the light emitting center to a second incidence position that is an incidence point of the second light beam on the incidence surface, the distance being in the direction along the central axis; $h2b$ is a distance in the second cross section from the second incidence position to a second emission position that is an emission point of the second light beam on the emission surface, the distance being in the direction along the central axis; $h3b$ is a distance in the second cross section from the second emission position to a second position to be irradiated that is the second reaching point of the second light beam on the surface to be irradiated, the distance being in the direction along the central axis; $θ1b$ is the second light emission angle that is, in the second cross section, an angle of a traveling direction of the second light beam relative to the central axis between the light emitting center and the incidence surface; $θ2b$ is, in the second cross section, an angle of the traveling direction of the second light beam relative to the central axis between the incidence surface and the emission surface; and $θ3b$ is, in the second cross section, an angle of the traveling direction of the second light beam relative to the central axis between the emission surface and the surface to be irradiated.

The first light emission angle $θ1a$ is determined by:

(1) in the first cross section, obtaining a first polynomial approximation function indicating a relation between a light emission angle θ1A and a light output angle θ3A, in which the light emission angle θ1A is an angle, relative to the central axis, of a traveling direction of an arbitrary light beam between the light emitting center and the incidence surface, the arbitrary light beam being emitted from the light emitting center, and the light output angle θ3A is an angle of the traveling direction of the arbitrary light beam relative to the central axis between the emission surface and the surface to be irradiated, (2) obtaining a first curve corresponding to first-order differentiation of the first polynomial approximation function, (3) determining one or more minimum points at which an inclination of the first curve changes from negative to positive, and one or more maximum points at which the inclination of the first curve changes from positive to negative, (4) for each of the one or more minimum points, identifying one corresponding maximum point whose light emission angle θ1A is larger than and closest to that of the minimum point, the maximum point being selected from the one or more maximum points, (5) from the one or more minimum points, identifying one minimum point that exhibits a largest difference between differential values Δθ3A of the light output angles θ3A thereof and of the corresponding maximum point, and determining the light emission angle θ1A of the identified minimum point as the first light emission angle θ1a; and the second light emission angle θ1b is determined by:

(1) in the second cross section, obtaining a second polynomial approximation function indicating a relation between a light emission angle θ1B and a light output angle θ3B, in which the light emission angle θ1B is an angle, relative to the central axis, of a traveling direction of an arbitrary light beam between the light emitting center and the incidence surface, the arbitrary light beam being emitted from the light emitting center, and the light output angle θ3B is an angle of the traveling direction of the arbitrary light beam relative to the central axis between the emission surface and the surface to be irradiated, (2) obtaining a second curve corresponding to first-order differentiation of the second polynomial approximation function, (3) determining one or more minimum points at which an inclination of the second curve changes from negative to positive, and one or more maximum points at which the inclination of the second curve changes from positive to negative, (4) for each of the one or more minimum points, identifying one corresponding maximum point whose light emission angle θ1B is larger than and closest to that of the minimum point, the maximum point being selected from the one or more maximum points, and (5) from the one or more minimum points, identifying one minimum point that exhibits a largest difference between differential values Δθ3B of the light output angles θ3B thereof and of the corresponding maximum point, and determining the light emission angle θ1B of the identified minimum point as the second light emission angle θ1b.

The light emitting device according to the present invention includes a light emitting element; and the light flux controlling member according to the present invention.

The surface light source device according to the present invention includes the light emitting device according to the present invention; and a light diffusing plate configured to transmit light emitted from the light emitting device while diffusing the light.

Further, the surface light source device according to the present invention includes: a plurality of the light emitting devices according to the present invention, which are disposed so that a plurality of the light emitting centers of a plurality of the light emitting elements are in a shape of a rectangular lattice; and a light diffusing plate configured to transmit light emitted from the light emitting devices while diffusing the light, in which formula (1) below is satisfied.

$$D1 < P < D2 \quad \text{Formula (1)}$$

In formula (1), D1 is half of a length of a long side of a unit lattice of the rectangular lattice, D2 is half of a length of a diagonal of the unit lattice of the rectangular lattice, and P is a distance from the central axis to an intersection of the light diffusing plate and a light beam emitted from the light emitting center of the light emitting element at the light emission angle θ1B corresponding to the second maximum value.

The display apparatus according to the present invention includes the surface light source device according to the present invention, and a member to be irradiated with light emitted from the surface light source device.

Advantageous Effects of Invention

The light flux controlling members according to the present invention are capable of suppressing the generation of a bright part on a surface to be irradiated even in a lattice shaped disposition. The light emitting device, surface light source device and display apparatus all according to the present invention are less likely to generate a bright part on a surface to be irradiated due to the presence therein of light flux controlling members capable of suppressing the generation of a bright part on the surface to be irradiated.

DESCRIPTION OF EMBODIMENTS

Hereinafter, a light flux controlling member, a light emitting device, a surface light source device and a display apparatus all according to the present invention will be described in detail with reference to the accompanying drawings. In the following description, as a representative example of the surface light source device of the present invention, described is a surface light source device suitable for a backlight of a liquid crystal display apparatus or the like, in which light emitting devices are disposed in a lattice shape.

(Configurations of Surface Light Source Device and Light Emitting Device)

Figure 1A:
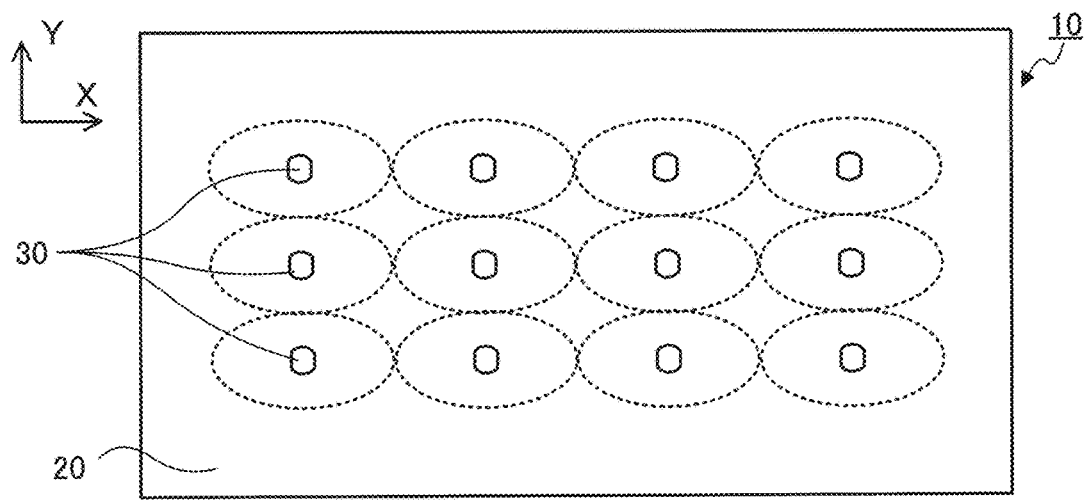
FIGS. 1A to 1C illustrate a configuration of a surface light source device disclosed in PTL 1.
Figure 1B:
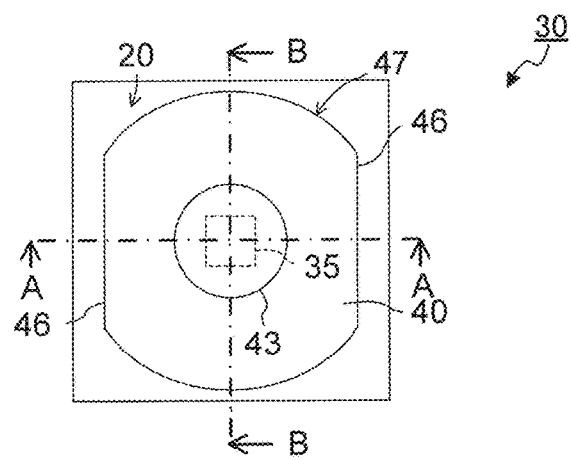
Figure 1C:
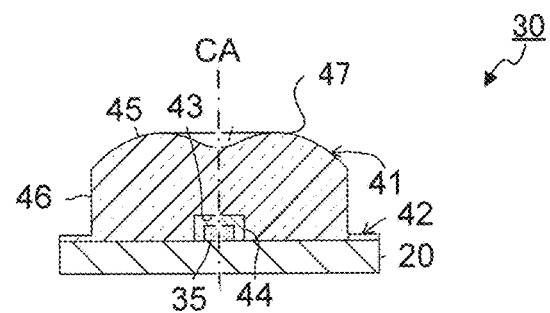
Figure 2A:
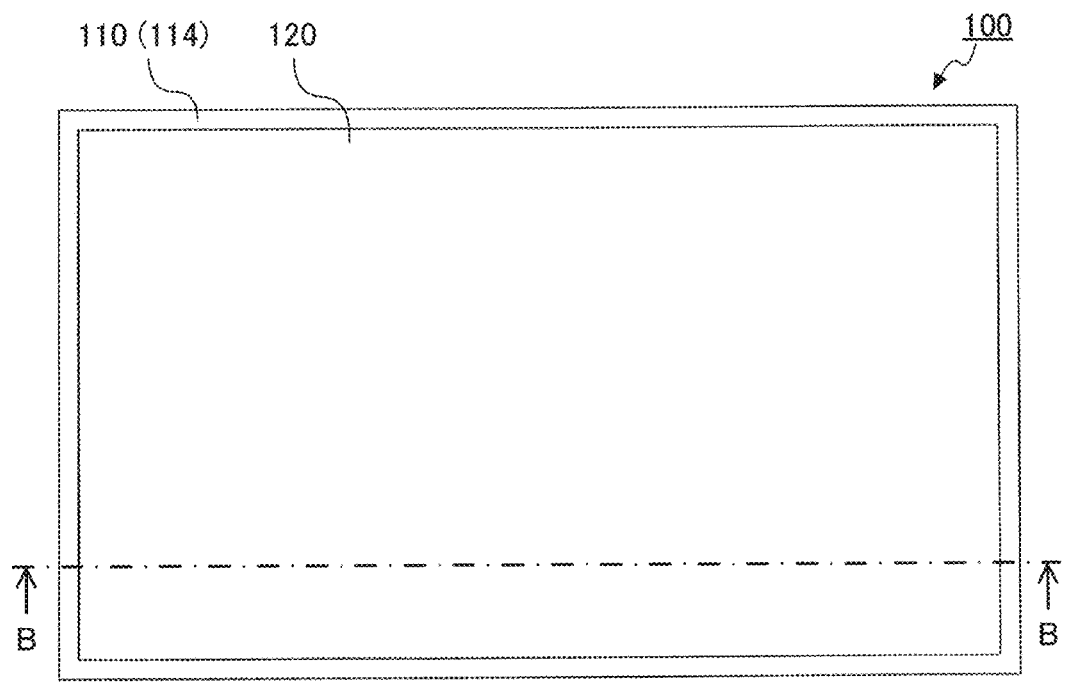
FIGS. 2A and 2B illustrate a configuration of a surface light source device according to an embodiment of the present invention.
Figure 4:
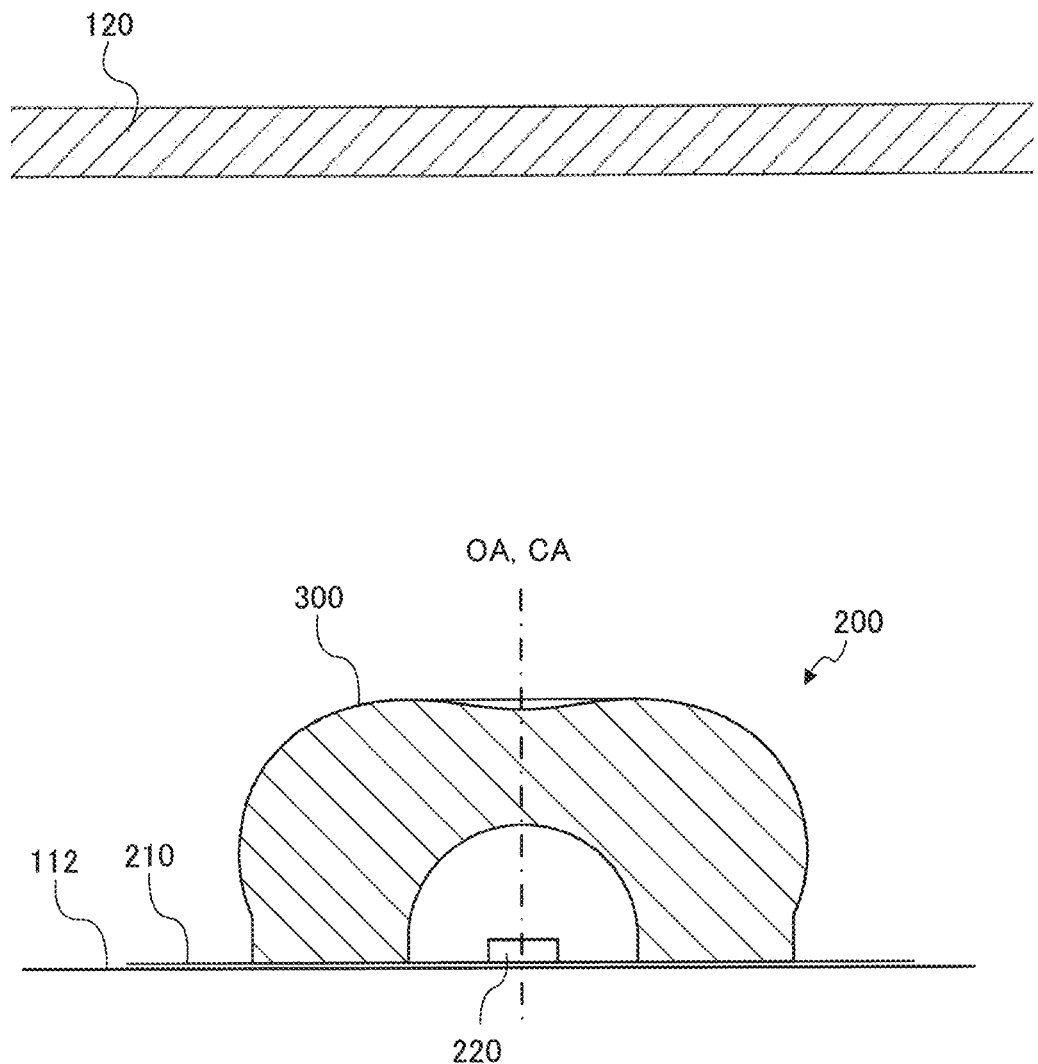
FIG. 4 is a partially enlarged cross-sectional view of the surface light source device according to the embodiment of the present invention.

FIGS. 2A to 4 illustrate a configuration of surface light source device 100 according to an embodiment of the present invention. FIG. 2A is a plan view of surface light source device 100 according to the embodiment of the present invention, and FIG. 2B is a front view of the same. FIG. 3A is a cross-sectional view taken along line A-A of FIG. 2B, and FIG. 3B is a cross-sectional view taken along line B-B of FIG. 2A. FIG. 4 is a partially enlarged cross-sectional view of surface light source device 100.

Figure 2B:
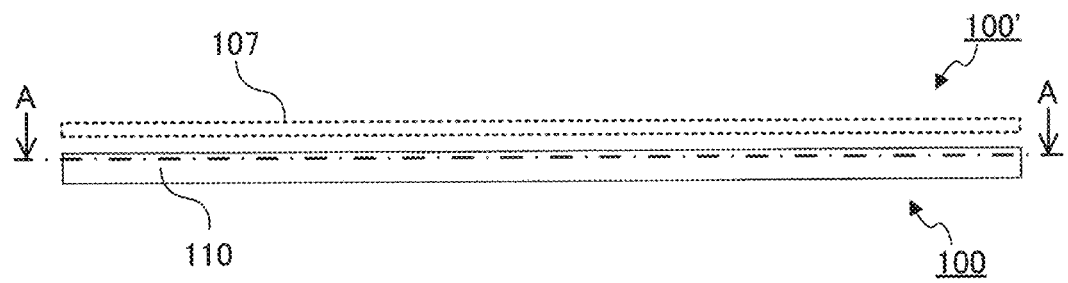
Figure 3A:
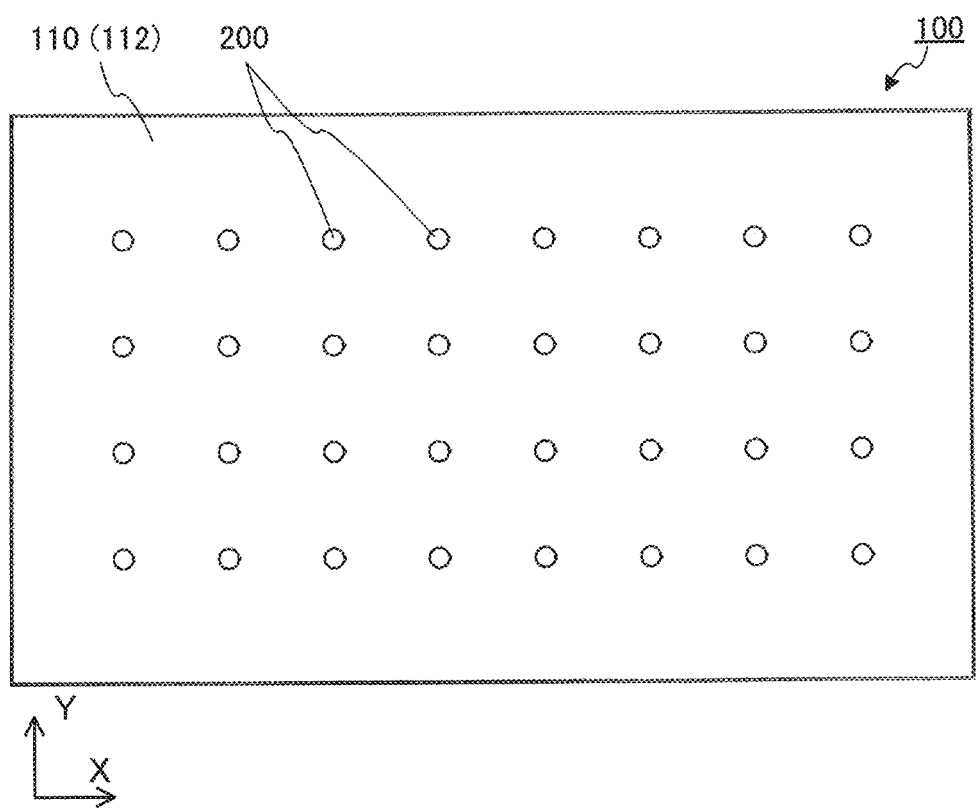
FIGS. 3A and 3B are cross-sectional views of the surface light source device according to the embodiment of the present invention.
Figure 3B:
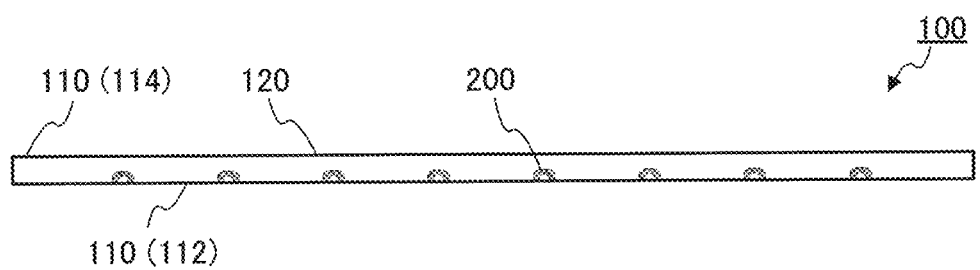

As illustrated in FIGS. 2A, 2B, 3A, 3B and 4, surface light source device 100 includes casing 110, a plurality of light emitting devices 200 and light diffusing plate (surface to be irradiated) 120. Surface light source device 100 of the present invention can be used for a backlight of a liquid crystal display apparatus or the like. As illustrated in FIG. 2B, surface light source device 100 can also be used as display apparatus 100' in combination with display member (member to be irradiated) 107, such as a liquid crystal panel (shown in a dotted line in FIG. 2B). Light emitting devices 200 are disposed in a lattice shape (square lattice shape in the present embodiment) on substrates 210 that are disposed on bottom plate 112 of casing 110. The inner surface of bottom plate 112 functions as a diffusion and reflection surface. Top plate 114 of casing 110 is provided with an opening. Light diffusion member 120 is disposed so as to cover the opening, and functions as a light emitting surface. The size of the light emitting surface is, for example, about 400 mm×700 mm Light emitting devices 200 are disposed on respective substrates 210 at a regular intervals. Substrates 210 are each fixed at a predetermined position on bottom plate 112 of casing 110. In the present embodiment, light emitting devices 200 are disposed so that the light emitting centers (light emitting surfaces) of respective light emitting elements 220 are positioned in a square lattice shape. Light emitting devices 200 each have light emitting element 220 and light flux controlling member 300.

Light emitting element 220 is a light source of surface light source device 100, and is mounted on substrate 210. Light emitting element 220 is a light emitting diode (LED), such as a white light emitting diode. Light emitting element 220 is disposed so that the light emitting center thereof is positioned on central axis CA.

Light flux controlling member 300 is a lens, and fixed on substrate 210. Light flux controlling member 300 is for controlling the distribution of light emitted from light emitting element 220 to expand the direction of the light to travel in the surface directions of substrate 210. Light flux controlling member 300 is disposed over light emitting element 220 so that central axis CA of light flux controlling member 300 coincides with optical axis OA of light emitting element 220 (refer to FIG. 4). Further, light flux controlling member 300 is disposed so that the light emitting center (light emitting surface) of light emitting element 220 is positioned at the curvature center of the vicinity of the top of below-described incidence surface 320 in the direction along optical axis OA of light emitting element 220 (refer to FIG. 4). Below-described incidence surface 320 and emission surface 330 of light flux controlling member 300 are rotationally symmetric (incidence surface 320 is circularly symmetric, and emission surface 330 is four-fold symmetric), and rotation axes of the surfaces coincide with optical axis OA of light emitting element 220. The rotation axes of incidence surface 320 and emission surface 330 are referred to as "central axis CA of light flux controlling member." "Optical axis OA of light emitting element" is a light beam that is in the center of three-dimensional light flux emitted from light emitting element 220.

Light flux controlling member 300 may be formed by integral molding. Any material capable of transmitting light having a desired wavelength may be used as a material for light flux controlling member 300. For example, the material of light flux controlling member 300 is a light-transmissive resin such as polymethylmethacrylate (PMMA), polycarbonate (PC), epoxy resin (EP) or silicone resin, or glass. The main feature of surface light source device 100 according to the present embodiment is in the configuration of light flux controlling member 300. Therefore, the feature that should be in light flux controlling member 300 will be described in detail below.

Light diffusion plate 120 is a plate-shaped member having light diffusivity, which transmits light emitted from light emitting device 200 while diffusing the light. Light diffusing plate 120 is disposed above light emitting devices 200 and substantially parallel to substrates 210. Typically, light diffusing plate 120 has a size substantially the same as a member to be irradiated, such as a liquid crystal panel. For example, light diffusing plate 120 is formed of a light-transmissive resin, such as polymethylmethacrylate (PMMA), polycarbonate (PC), polystyrene (PS) or styrene-methylmethacrylate copolymer resin (MS). To confer light diffusivity, fine irregularities are formed on the surface of light diffusing plate 120, or light diffusion elements such as beads are dispersed in light diffusing plate 120.

In surface light source device 100 according to the present invention, light flux controlling member 300 expands light emitted from each light emitting element 220 for illuminating a broad range of light diffusing plate 120. As described below, light distribution characteristics of light flux controlling member 300 in the directions along an array lattice of light emitting devices 200 (X-direction and Y-direction) are different from that in the diagonal direction of the array lattice. This enables substantially uniform illumination of the inner surface of light diffusing plate 120. The light reaching light diffusing plate 120 from each light flux controlling member 300 passes through light diffusing plate 120 while being diffused. Consequently, surface light source device 100 according to the present invention can uniformly illuminates a planar member to be irradiated (e.g., a liquid crystal panel).

(Configuration of Light Flux Controlling Member)

Figure 5A:
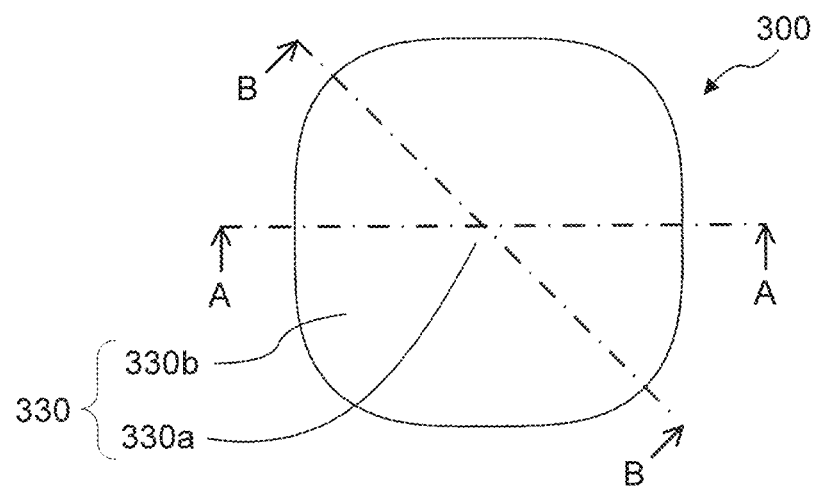
FIGS. 5A to 5C illustrate a configuration of a light flux controlling member according to an embodiment of the present invention.
Figure 5B:
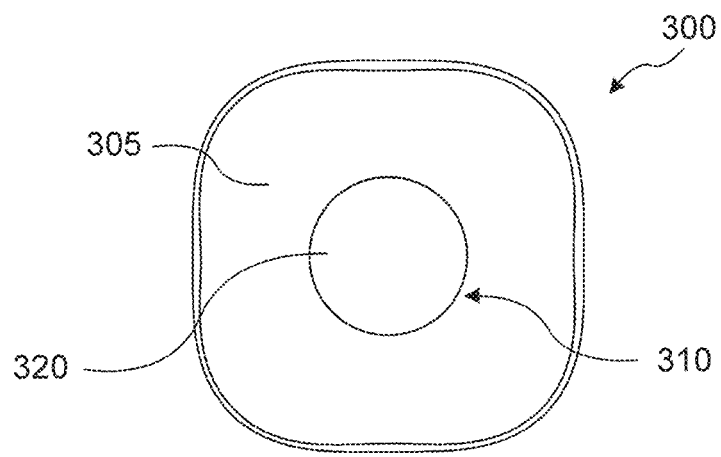
Figure 5C:
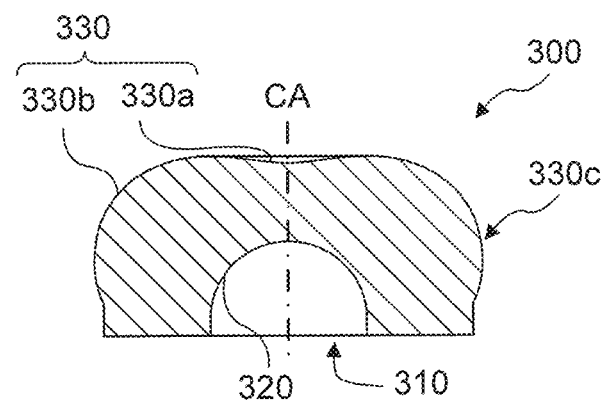

FIGS. 5A to 5C illustrate a configuration of light flux controlling member 300 according to an embodiment of the present invention. FIG. 5A is a plan view of light flux controlling member 300, FIG. 5B is a bottom view of the same, and FIG. 5C is a cross-sectional view taken along line A-A of FIG. 5A.

As illustrated in FIGS. 5A to 5C, light flux controlling member 300 includes incidence surface 320, that is an inner surface of recess 310, and emission surface 330. Light flux controlling member 300 may further include a flange for easier handling of light flux controlling member 300, and legs for forming a space to allow heat generated from light emitting element 220 to disperse outside as well as for positioning and fixing light flux controlling member 300 on substrate 210 (neither is illustrated). Light flux controlling member 300 in the present embodiment has a shape of a substantial square subjected to round chamfering in plan view.

Recess 310 is disposed in a central portion of rear surface 305 so as to intersect central axis CA of light flux controlling member 300 (optical axis OA of light emitting element 220) (refer to FIG. 4). The inner surface of recess 310 functions as incidence surface 320. That is, incidence surface 320 is disposed so as to intersect central axis CA (optical axis OA). Incidence surface 320 allows most of light emitted from light emitting element 220 to enter inside light flux controlling member 300 while controlling the traveling direction of the light. Incidence surface 320 intersects central axis CA of light flux controlling member 300, and is rotationally symmetric with central axis CA as a rotation axis (circularly symmetric in the present embodiment).

Rear surface 305 is a flat surface which is on the rear side of light flux controlling member 300, and extending radially from the opening edge of recess 310.

Emission surface 330 is disposed on the front side of light flux controlling member 300 (light diffusing plate 120 side). Emission surface 330 emits the light entering light flux controlling member 300 toward the outside while controlling the traveling direction of the light. Emission surface 330 intersects central axis CA, and is rotationally symmetric with central axis CA as a rotation axis (four-fold symmetric in the present embodiment).

Emission surface 330 includes first emission surface 330a positioned in a predetermined range about central axis CA, and second emission surface 330b continuously formed from the periphery of first emission surface 330a. First emission surface 330a is a curved surface protruding toward the rear side. First emission surface 330a may have any value as the curvature thereof in a first cross section or in a second cross section. In the present embodiment, first emission surface 330a has the same curvature in the first cross section and the second cross section. "First cross section" is a cross section including central axis CA and a point which is closest to central axis CA and which is in the outer edge of emission surface 330, and is a cross section taken along line A-A of FIG. 5A. "Second cross section" is a cross section including central axis CA and a point which is farthest from central axis CA and which is in the outer edge of emission surface 330. In the present embodiment, "second cross section" is a cross section obtained by rotating the first cross section by 45° with central axis CA as the axis, and is a cross section taken along line B-B of FIG. 5A.

Second emission surface 330b is a smoothly curved surface which is protruding toward the front side, and positioned at the periphery of first emission surface 330a. In the present embodiment, second emission surface 330b has different values in curvature between the first cross section and the second cross section. Second emission surface 330b includes overhanging part 330c at a position farthest from central axis CA in a cross section including the central axis. "Overhanging part" is a part which is in the outer edge of second emission surface 330b, and which protrudes outside in the direction perpendicular to central axis CA as compared to the bottom edge of second emission surface 330b, which is positioned at the bottom in the direction along central axis CA. In the present embodiment, control is performed so that part of light emitted from light emitting element 220, which has a large angle relative to optical axis OA as compared to the other part of the light, can also be used as light effectively illuminating light diffusing plate 120 (surface to be irradiated), due to the presence of overhanging part 330c in second emission surface 330b.

(Light Distribution Characteristics of Light Emitting Device)

Figure 6A:
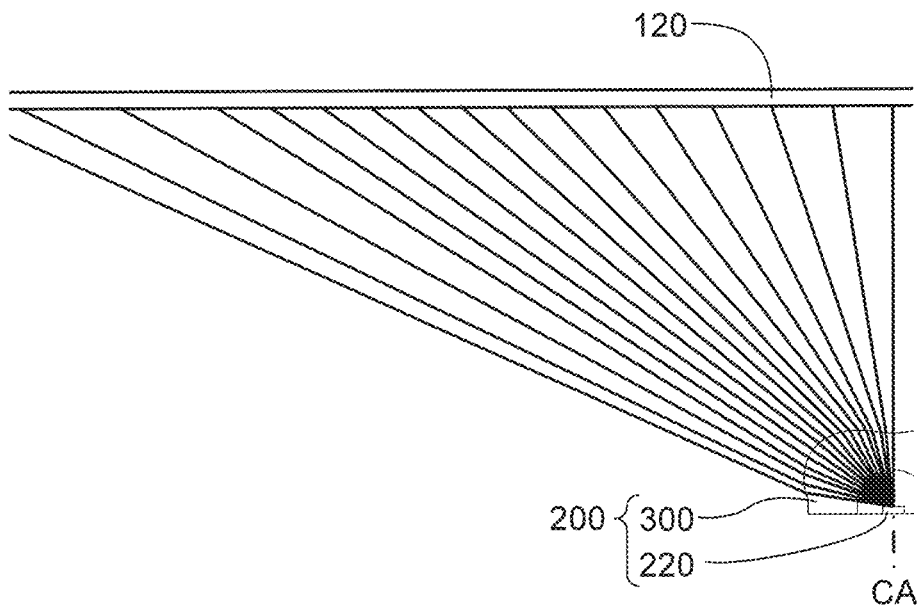
FIGS. 6A and 6B illustrate optical paths in a light emitting device.
Figure 6B:
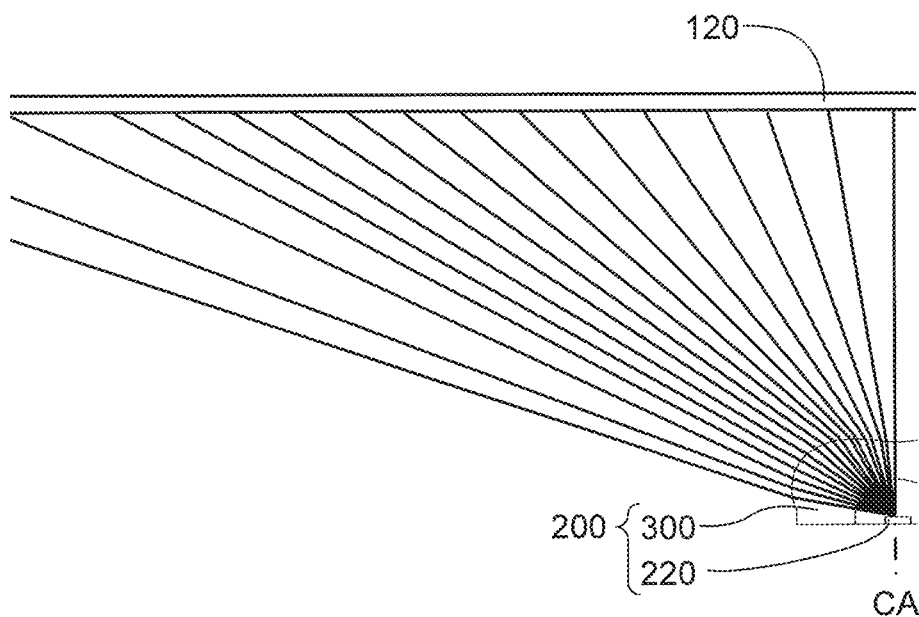

FIGS. 6A and 6B illustrate optical paths in light emitting device 200. FIG. 6A illustrates optical paths of light emitting device 200 in the first cross section, and FIG. 6B in the second cross section. In FIGS. 6A and 6B, hatching to light emitting element 220 and light flux controlling member 300 is omitted for clearly showing the optical paths. Light beams indicated by the optical paths in FIGS. 6A and 6B are light beams with light emission angles from 0° to 80° at every 5°, respectively. Further, light diffusing plate 120 is illustrated in FIGS. 6A and 6B for showing a region to be irradiated in light emitting device 200.

As illustrated in FIGS. 6A and 6B, in the first and second cross sections, light which is emitted from light emitting element 220 at a relatively small light emission angle is controlled, while being expanded, to travel toward a central portion of the region to be irradiated formed in light diffusing plate 120 (vicinity of central axis CA of light flux controlling member 300). This enables uniform irradiation of a central portion of the surface to be irradiated with the light emitted from light emitting device 200 without forming an excessively bright part in the central portion of the surface to be irradiated. On the other hand, light which is emitted from light emitting element 220 at a large light emission angle is controlled, while being concentrated, to travel toward the edge of the region to be irradiated. Accordingly, light emitted from light emitting device 220 is controlled so that when an edge of a region to be irradiated, which is to be illuminated by the light emitted from this one light emitting device 220, is irradiated with the light, and when the edge overlaps an edge of another region to be irradiated, which is to be illuminated by light emitted from adjacent light emitting device 220, the brightness of the edge becomes substantially the same as that of the central portion of the region to be irradiated.

Light flux controlling member 300 according to the present embodiment is specified by the following two perspectives.

[First Perspective]

In the first perspective, regarding the more specific shape of light flux controlling member 300, light flux controlling member 300 is necessary to include the above-described incidence surface 320 and the above-described emission surface 330 which has first emission surface 330a and second emission surface 330b, and also a first maximum value to be determined by "determination of first maximum value" is necessary to become less than a second maximum value to be determined by "determination of second maximum value."

Figure 7:
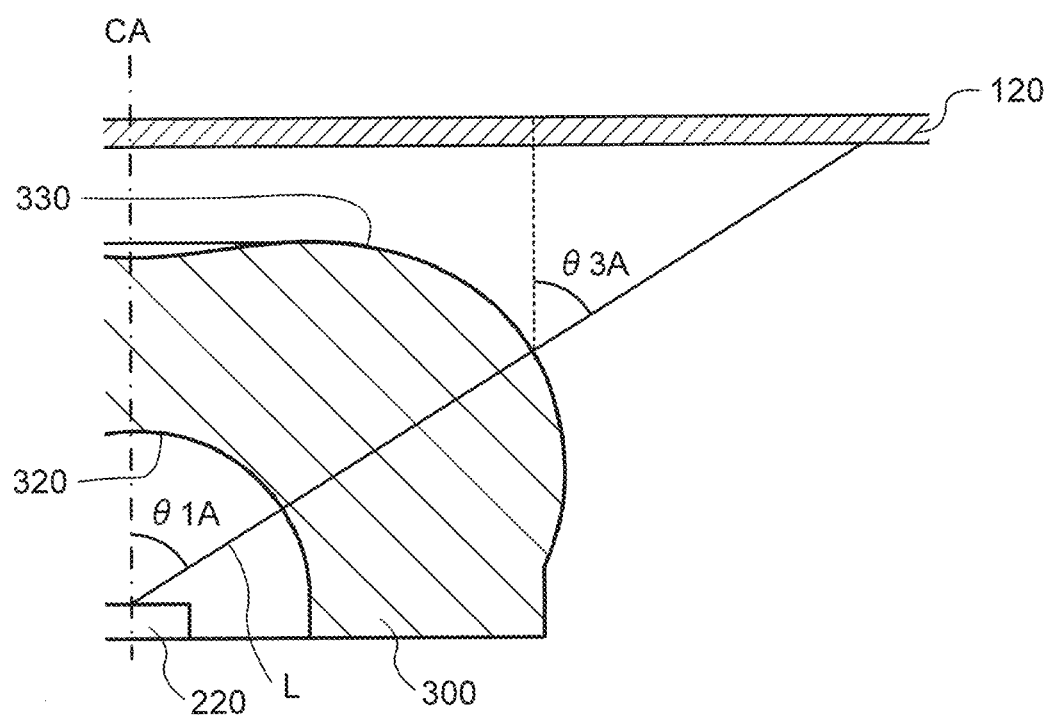
FIG. 7 is a diagram for describing a light emission angle and a light output angle.

In the following, "determination of first maximum value" and "determination of second maximum value" will be described. FIG. 7 is a diagram for describing a light emission angle and a light output angle. In FIG. 7, an optical path in the first cross section is illustrated. As illustrated in FIG. 7, in the first cross section which includes central axis CA of light flux controlling member 300, and a point closest to central axis CA and in the outer edge of emission surface 330, an angle of the traveling direction of arbitrary light beam L, which is emitted from the light emitting center and travels between the light emitting center and incidence surface 320, relative to central axis CA is referred to as "light emission angle θ1A"; and an angle of the traveling direction of this arbitrary light beam L between emission surface 330 and surface to be irradiated 107 relative to central axis CA is referred to as "light output angle θ3A." In the present embodiment, "first cross section" is a cross section taken along line A-A of FIG. 5A. The first cross section is also a cross section which includes central axis CA and a straight line connecting two adjacent light emitting centers on a lattice line.

In a similar manner, although no drawing is provided herein, in the second cross section which includes central axis CA of light flux controlling member 300, and a point farthest from central axis CA and in the outer edge of emission surface 330, an angle of the traveling direction of arbitrary light beam L, which is emitted from the light emitting center and travels between the light emitting center and incidence surface 320, relative to central axis CA is referred to as "light emission angle θ1B"; and an angle of the traveling direction of this arbitrary light beam L between emission surface 330 and surface to be irradiated 107 relative to central axis CA is referred to as "light output angle θ3B." In the present embodiment, "second cross section" is a cross section taken along line B-B of FIG. 5A. The second cross section is also a cross section which includes central axis CA and a straight line connecting two adjacent light emitting centers on a diagonal of a unit lattice.

Figure 8A:
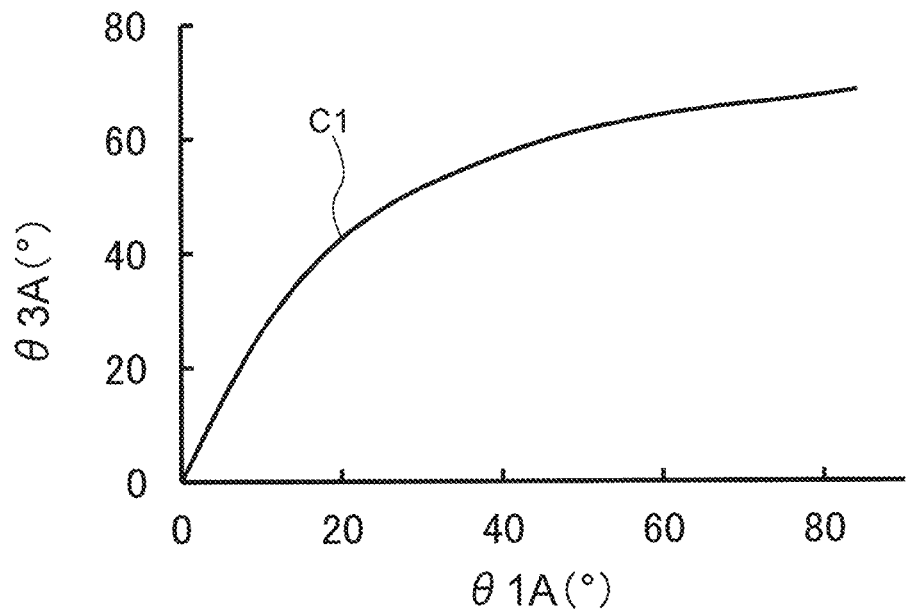
FIGS. 8A and 8B are graphs for describing determination of a first maximum value.
Figure 8B:
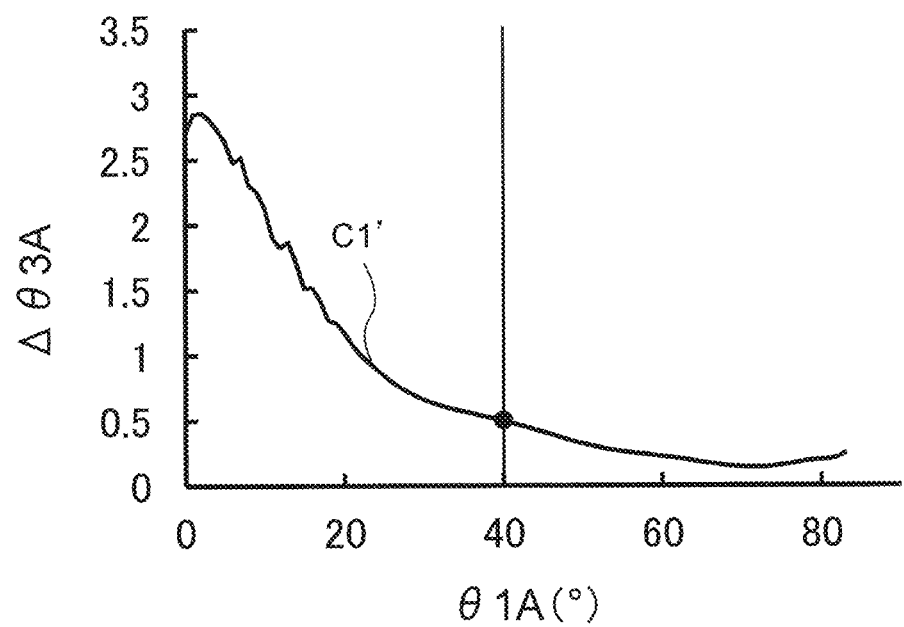

FIGS. 8A and 8B are graphs for describing determination of the first maximum value. FIG. 8A is a graph which shows first polynomial approximation function C1 indicating the relation between light emission angle θ1A of a light beam emitted from the light emitting center of light emitting element 220, and light output angle θ3A of the light beam. FIG. 8B is a graph which shows first curve C1' corresponding to first-order differentiation of first polynomial approximation function C1. In FIG. 8A, the abscissa represents light emission angle θ1A (°), and the ordinate represents light output angle θ3A (°). In FIG. 8B, the abscissa represents light emission angle θ1A (°), and the ordinate represents a first-order differential value of light output angle θ3A (°).

Figure 9A:
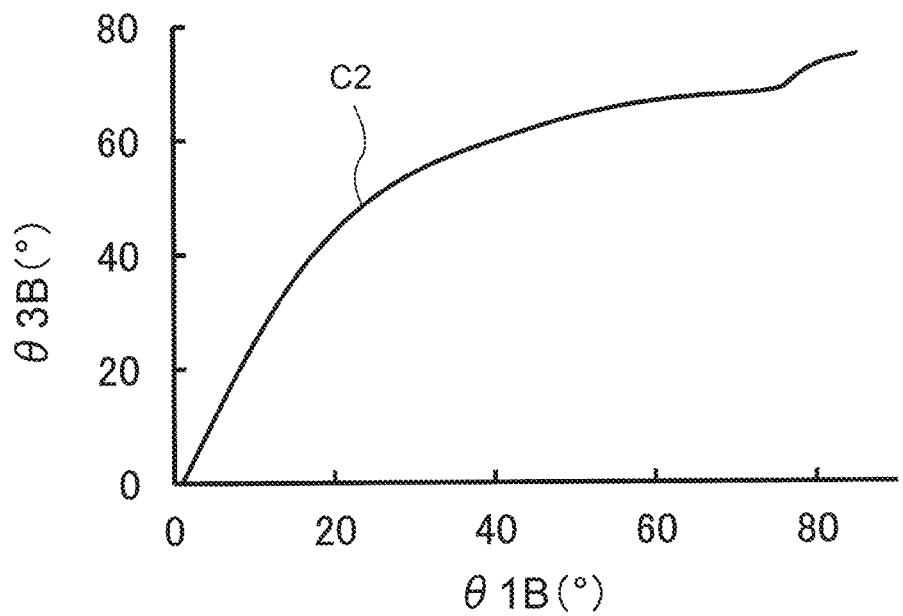
FIGS. 9A and 9B are graphs for describing determination of a second maximum value.
Figure 9B:
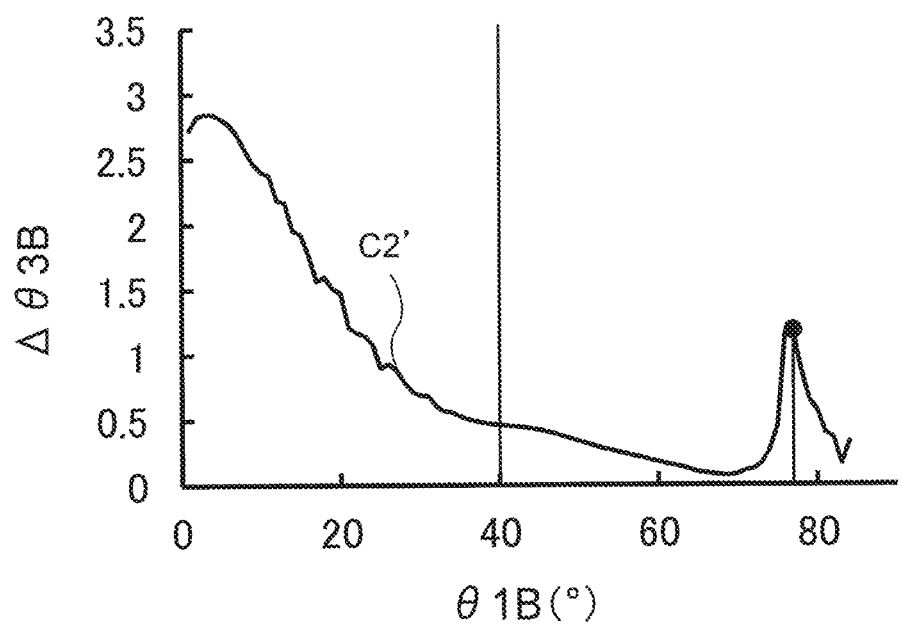

FIGS. 9A and 9B are graphs for describing determination of the second maximum value. FIG. 9A is a graph which shows second polynomial approximation function C2 indicating the relation between light emission angle θ1B of a light beam emitted from the light emitting center of light emitting element 220, and light output angle θ3B of the light beam. FIG. 9B is a graph which shows second curve C2' corresponding to first-order differentiation of second polynomial approximation function C2. In FIG. 9A, the abscissa represents light emission angle θ1B (°), and the ordinate represents light output angle θ3B (°). In FIG. 9B, the abscissa represents light emission angle θ1B (°), and the ordinate represents a first-order differential value of light output angle θ3B (°).

The determination of the first maximum value is as follows.

(1) In the first cross section, obtained is first polynomial approximation function C1 which indicates the relation between light emission angle θ1A of an arbitrary light beam emitted from the light emitting center, and light output angle θ3A of the arbitrary light beam (refer to FIG. 8A).

(2) First curve C1' corresponding to first-order differentiation of the first polynomial approximation function is obtained (refer to FIG. 8B).

(3) The first maximum value is determined, which is a maximum value in the first curve C1' in the case where light emission angle θ1A is more than 40° (refer to FIG. 8B).

In the present embodiment, the first maximum value determined in the above manner is about 0.5, and light emission angle θ1A in this instance is 40° (refer to FIG. 8B).

The determination of the second value is as follows.

(1) In the second cross section, obtained is second polynomial approximation function C2 which indicates the relation between light emission angle θ1B of an arbitrary light beam emitted from the light emitting center, and light output angle θ3B of the arbitrary light beam (refer to FIG. 9A).

(2) Second curve C2' corresponding to first-order differentiation of the second polynomial approximation function is obtained (refer to FIG. 9B).

(3) The second maximum value is determined, which is a maximum value in the second curve C2' in the case where light emission angle θ1B is more than 40° (refer to FIG. 9B).

In the present embodiment, the second maximum value determined in the above manner is about 1.2, and light emission angle θ1B in this instance is about 76° (refer to FIG. 9B).

When "the second maximum value is more than the first maximum value" as described above, local light-dark variability in the rear surface (surface to be irradiated 107) of light diffusing plate 120 is larger in the line B-B direction than in the line A-A direction in FIG. 5A. As described below, this related to designing such that excessive light irradiation to four corners of an irradiation target region in the rear surface (surface to be irradiated 107) of light diffusing plate 120 is suppressed.

Figure 10:
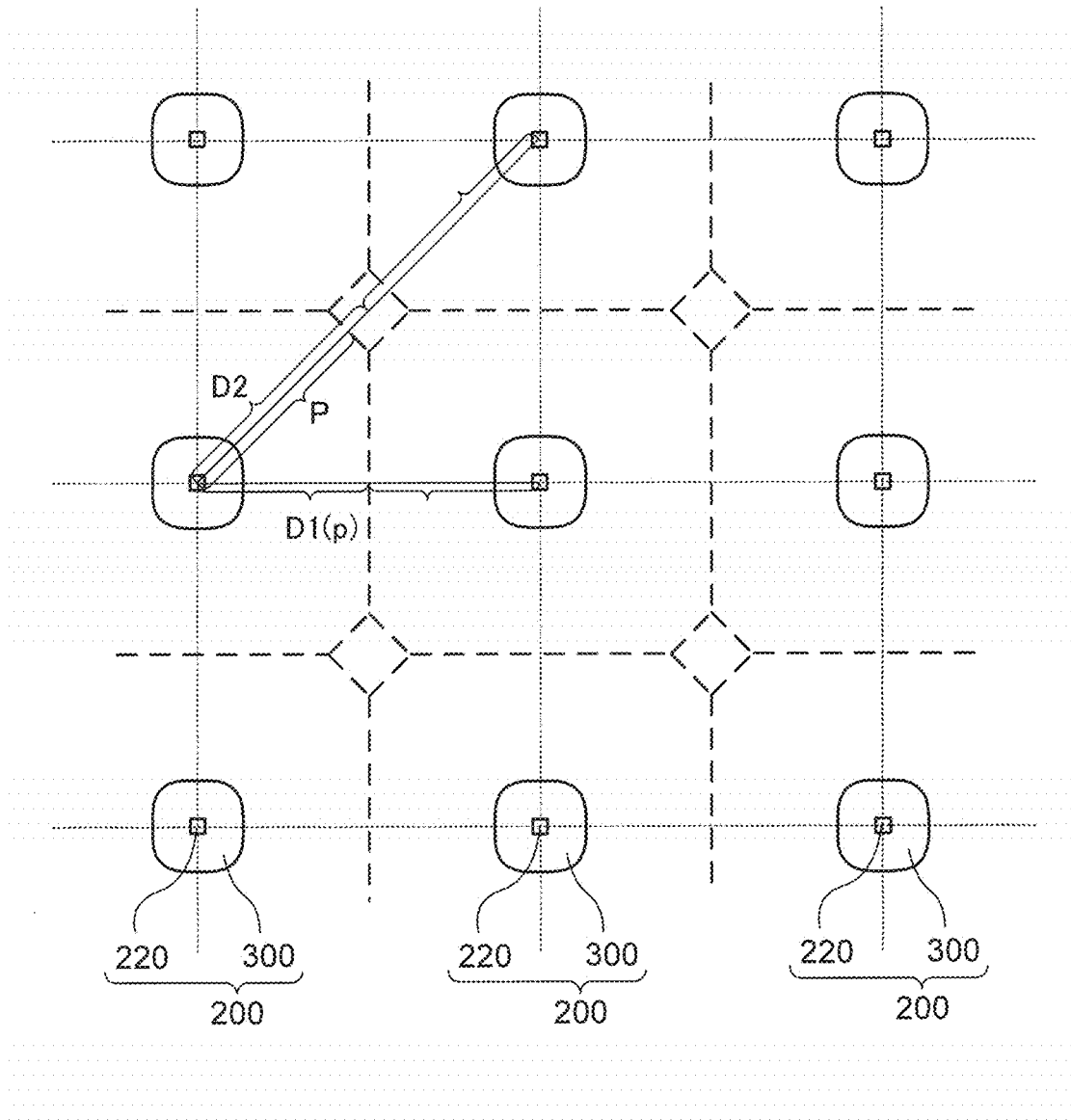
FIG. 10 is a diagram for describing formula (1)

Regarding the first and second cross sections, the edge position of the irradiation target region in the rear surface (surface to be irradiated 107) of light diffusing plate 120 will be described in the following. FIG. 10 is a diagram for describing the edge position of the irradiation target region in the rear surface (surface to be irradiated 107) of light diffusing plate 120. In FIG. 10, a broken line illustrates an irradiation target region when surface light source device 100 having light flux controlling members 300 is viewed from light diffusing plate 120 side.

In the present embodiment, light emitting devices 200 are disposed so that light emitting centers of light emitting elements 220 are positioned in a square lattice shape, as illustrated in FIG. 10. In this manner, namely light emitting devices 200 being disposed so that the light emitting centers of light emitting elements 220 are positioned in a square lattice shape, each of light flux controlling members 300 having a shape of a substantial square subjected to round chamfering in plan view is disposed in correspondence with the square lattice so that "first cross section" (a cross section taken along line A-A in FIG. 5A) is along a side of a unit lattice of the square lattice, and "second cross section" (a cross section taken along line B-B in FIG. 5A) is along a diagonal of the unit lattice of the square lattice.

In this case, light flux controlling member 300 (light emitting device 200) according to the present embodiment satisfies the following formula (1).

$$D1<P<D2 \qquad \text{Formula (1)}$$

As illustrated in FIG. 10, in formula (1), D1 is half the length of a straight line connecting two adjacent light emitting centers on a side of a unit lattice of the square lattice (half the length of one side of a unit lattice of the square lattice). D2 is half the length of a straight line connecting two adjacent light emitting centers on a diagonal of a unit lattice of the square lattice (half the length of a diagonal of a unit lattice of the square lattice). P is a distance from central axis CA to the intersection of the rear surface of light diffusing plate 120 and a light beam emitted from light emitting element 220 at light emission angle θ1B corresponding to the second maximum value. As illustrated in FIG. 10, P specifies the edge position, in the diagonal direction of a unit lattice of the square lattice, of an irradiation target region which is illuminated by light flux controlling member 300 (light emitting device 200). Further, distance p, namely a distance from central axis CA to the intersection of the rear surface of light diffusing plate 120 and a light beam which is emitted from light emitting element 220 at light emission angle θ1A corresponding to the first maximum value, is set to be substantially equal to or less than D1.

The present inventors have found that, in the case where light emitting elements 220 are disposed so that light emitting centers thereof positioned in a square lattice shape, the generation of a bright part on the rear surface (surface to be irradiated 107) of light diffusing plate 120 can be suppressed by adjusting the shape of emission surface 330 (in particular second emission surface 330b) of light flux controlling member 300 so as to satisfy the above formula (1). It is deduced that a substantially square irradiation target region formed by one of light emitting devices 200 has lower luminance in four corners than in other parts thereof, thereby reducing the possibility of the generation of a bright part which is caused by overlapping of four irradiation target regions in the vicinity of a central portion of a unit lattice.

(Effects)

Due to the second maximum value larger than the first maximum value as described above, light flux controlling members 300 according to the present embodiment in a lattice shaped disposition are capable of suppressing the generation of a bright part on the surface to be irradiated. A light emitting device, a surface light source device and a display apparatus which include these light flux controlling members 300 are also capable of suppressing the generation of a bright part.

In the present embodiment, the light emitting centers of light emitting elements 220 are disposed in a square lattice shape, however, the light emitting centers of light emitting elements 220 may be disposed, for example, in a rectangular lattice shape in the present invention. For a rectangular lattice, the designing is made such that P is shorter than half the length of a diagonal of a unit lattice (D1), and longer than half the length of a long side of the unit lattice (D2).

Figure 11A:
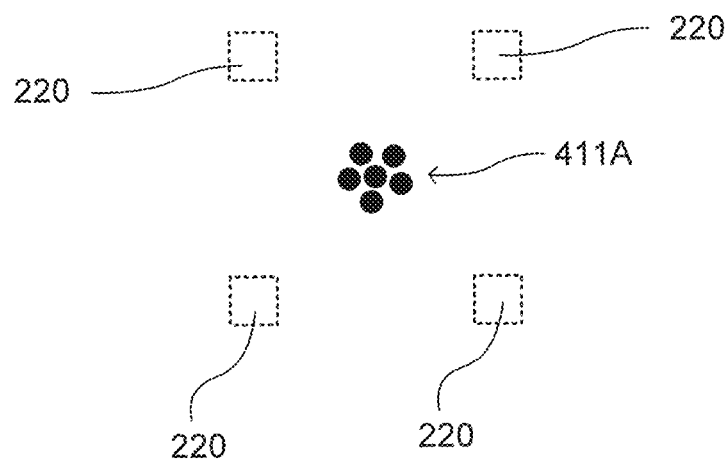
FIGS. 11A and 11B are diagrams for describing alleviation parts.
Figure 11B:
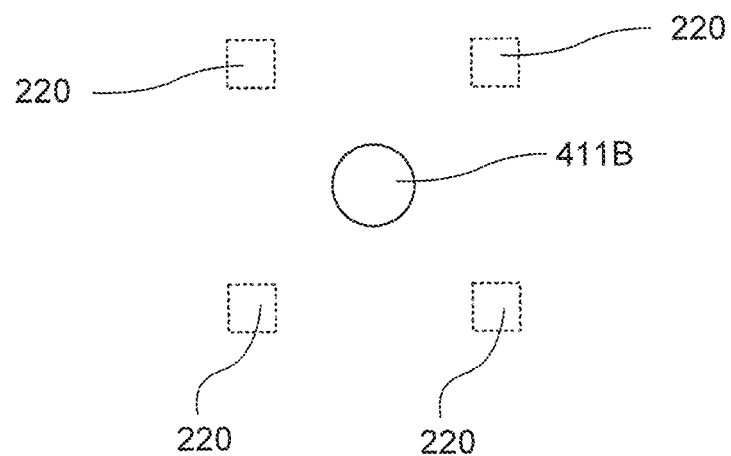

Bottom plate 112 may include an alleviation part for further alleviating (suppressing) the generation of a bright part. FIG. 11A is a diagram for describing alleviation part 411A, and FIG. 11B is a diagram for describing another alleviation part 411B. In FIGS. 11A and 11B, light emitting elements are shown in a dotted line for clearly showing the positions of alleviation parts 411A and 411B.

Part of light emitted from light emitting element 220 reaches the surface to be irradiated by the control of light flux controlling member 300. Another part of the light emitted from light emitting element 220 reaches the surface of bottom plate 112 by the control of light flux controlling member 300. The light reaching the surface of bottom plate 112 is reflected toward the surface to be irradiated. Part of light reaching the surface to be irradiated is thus the light reflected by bottom plate 112; therefore, the generation of a bright part in the surface to be irradiated can be further suppressed by reducing the light reflected by bottom plate 112. Accordingly, alleviation parts 411A and 411B are each formed, in bottom plate 112, in at least a part of a region where light possibly generating a bright part in the surface to be irradiated is reflected. As illustrated in FIGS. 11A and 11B, alleviation parts 411A and 411B are each formed in the periphery of the intersection of diagonals of a unit lattice, in the present embodiment. The configuration of each of alleviation parts 411A and 411B may be appropriately designed in a range capable of suppressing reflection of light reaching the surface of bottom plate 112. As illustrated in FIG. 11A, alleviation part 411A may be a black printed part that does not reflect light. Alternatively, as illustrated in FIG. 11B, alleviation part 411B may be formed by cutting out a region which may cause a bright part.

Figure 12A:
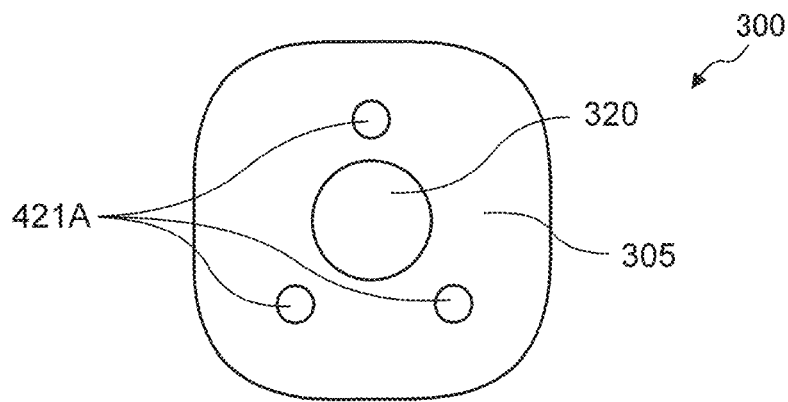
FIGS. 12A to 12C are diagrams for describing legs.
Figure 12B:
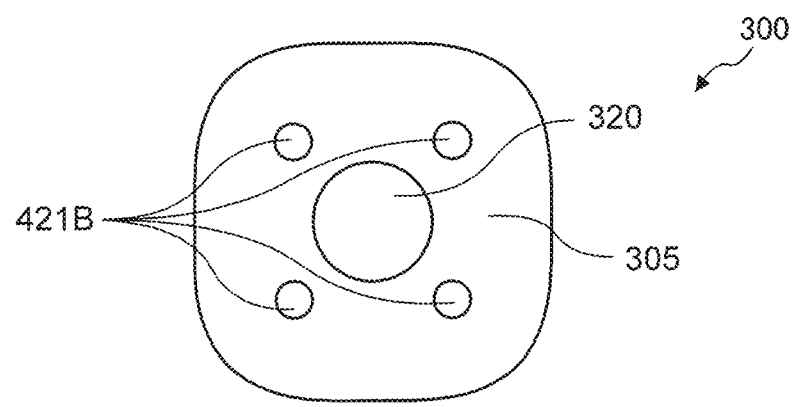
Figure 12C:
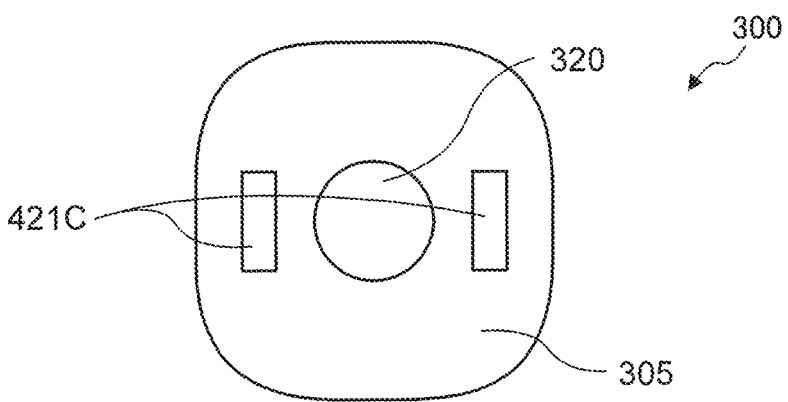

As described above, light flux controlling member 300 may include legs for positioning and fixing on substrate 210. FIGS. 12A to 12C are bottom views of light flux controlling members 300 according to modifications. FIGS. 12A to 12C are bottom views of light flux controlling members 300 according to Modifications 1 to 3, respectively.

The shape of each of legs 421A, 421B and 421C may be appropriately selected in a range capable of achieving the above-described functions. For example, each of legs 421A, 421B and 421C may be in a shape of a cylinder or in a prism. In the present embodiment, legs 421A and 421B of light flux controlling members 300 according to respective Modifications 1 and 2 are both in a shape of a cylinder. Legs 421C of light flux controlling member 300 according to Modification 3 are in a shape of a prism. Legs 421A, 421B and 421C are bonded on substrate 210 using an adhesive or the like. As illustrated in FIG. 12A, three legs 421A may be disposed on rear surface 305 so as to surround incidence surface 320. As illustrated in FIG. 12B, four legs 421B may be disposed on rear surface 305 so as to surround incidence surface 320. As illustrated in FIG. 12C, two legs may be disposed so as to place incidence surface 320 therebetween. When four legs 412B are disposed on light flux controlling member 300 as illustrated in FIG. 12B, only three out of four legs 412B may be bonded. The presence of legs 421A, 421B or 421C enables prevention of mounting in a wrong direction of light flux controlling member 300 on substrate 210. Further, as illustrated in FIGS. 12B and 12C, with light flux controlling members 300 in which legs 421B or 421C are disposed in a rotationally symmetric positions with central axis CA of light flux controlling member 300 as the rotation center, the mounting direction thereof can be changed for every light emitting device 200. This enables random disposition of gate positions of light emitting devices 200 used for surface light source device 100. Therefore, the generation of luminance unevenness due to gates generated during injection molding can be suppressed.

[Second Perspective]

In the second perspective, regarding the more specific shape of light flux controlling member 300, light flux controlling member 300 is necessary to include the above-described incidence surface 320 and the above-described emission surface 330 which has first emission surface 330a and second emission surface 330b, and also satisfy formulas (2) to (4) described below.

Figure 13A:
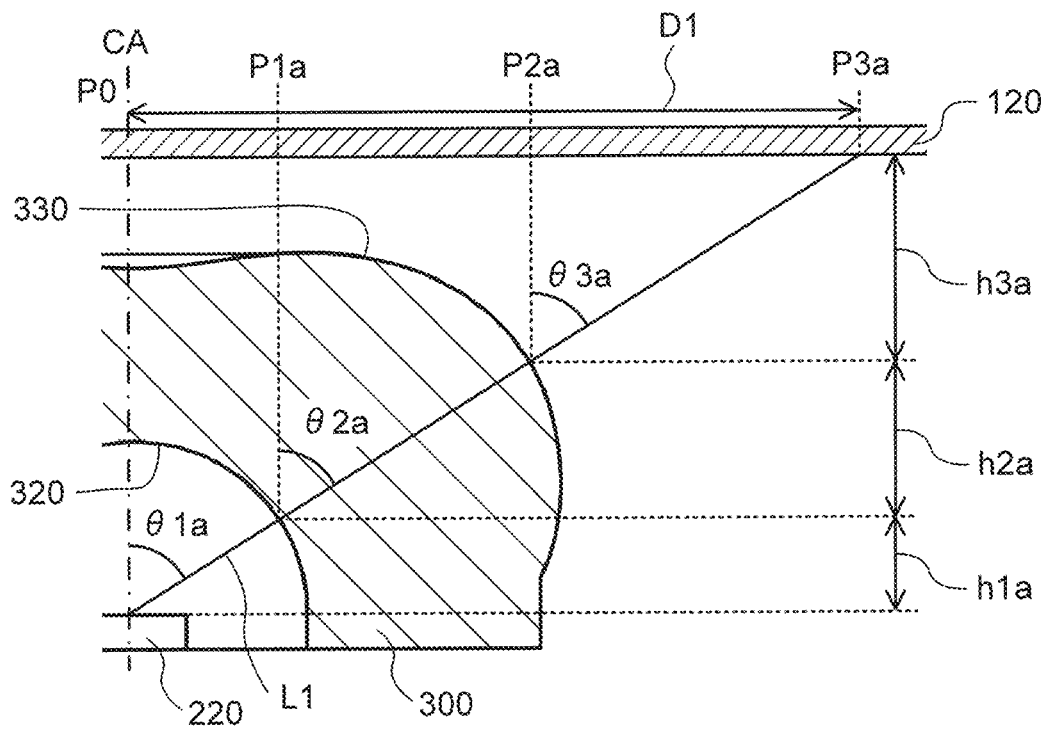
FIGS. 13A and 13B are diagrams for describing formulas (2) to (4)
Figure 13B:
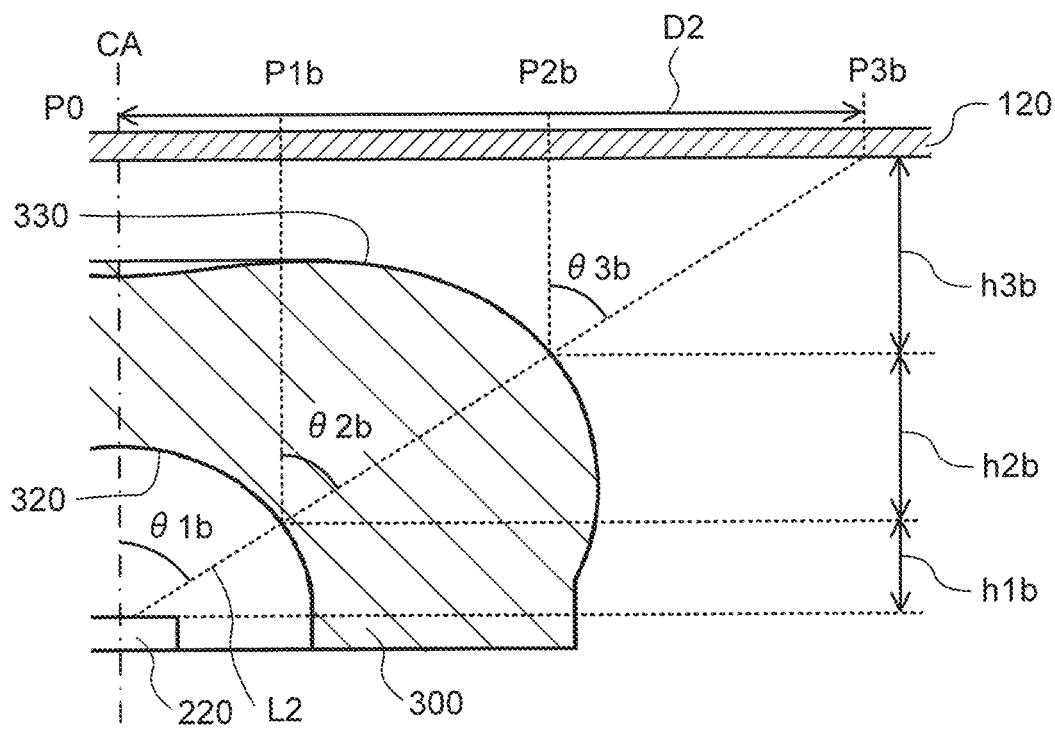

FIGS. 13A and 13B are diagrams for describing formulas (2) to (4). FIG. 13A is a diagram for describing formulas (2) and (3), and corresponds to the above-described first cross section. FIG. 13B is a diagram for describing formulas (2) and (4), and corresponds to the above-described second cross section. In FIGS. 13A and 13B, optical paths of light emitted from light emitting elements 220 are shown in a straight line for simplifying the diagrams.

Light flux controlling member 300 according to the present embodiment satisfies the following formula (2) when light emitting element 220 is disposed so that the light emitting center thereof is positioned on central axis CA and disposed to face recess 310, and a surface to be irradiated is disposed above emission surface 330 so as to be orthogonal to central axis CA.

$$D1 < D2 < D1 \times \sqrt{2} \qquad \text{Formula (2)}$$

In formula (2), D1 is a first reaching distance determined by formula (3) below, namely, in the first cross section which includes central axis CA, and a point closest to central axis CA and in the outer edge of emission surface 330, a distance from central axis CA to reaching point P3a, on the surface to be irradiated, of first light beam L1 emitted from light emitting center P0 of light emitting element 220 at first light emission angle θ1a. D2 is a second reaching point determined by formula (4) below, namely, in the second cross section which includes central axis CA, and a point farthest from central axis CA and in the outer edge of emission surface 330, a distance from central axis CA to reaching point P3b, on the surface to be irradiated, of second light beam L2 emitted from light emitting center P0 of light emitting element 220 at second light emission angle θ1b. First light emission angle θ1a is determined by the "determination of first light emission angle" below. Second light emission angle θ1b is determined by the "determination of second light emission angle" below. In the present embodiment, formula (2) above indicates that light emitted from light emitting element 220 does not reach four corners of a square region to be irradiated formed on the surface to be irradiated (light diffusing plate 120).

In the following, the determination of first reaching distance D1 will be described.

First reaching distance D1 is determined by the following formula (3).

$$D1 = h1a + \tan\theta1a + h2a \tan\theta2a + h3a \tan\theta3a \quad \text{Formula (3)}$$

As illustrated in FIG. 13A, in the above formula (3), $h1a$ is a distance in the first cross section from light emitting center P0 to first incidence position P1a that is an incidence point of first light beam L1 on incidence surface 320, in the direction along central axis CA; $h2a$ is a distance in the first cross section from first incidence position P1a to first emission position P2a that is an emission point of first light beam L1 on emission surface 330, in the direction along central axis CA; and $h3a$ is a distance in the first cross section from first emission position P2a to first position to be irradiated P3a that is a reaching point of first light beam L1 on the surface to be irradiated, in the direction along central axis CA. In the formula, $\theta1a$ is first light emission angle that is an angle of the traveling direction of first light beam L1 relative to central axis CA between light emitting center P0 and incidence surface 320; $\theta2a$ is, in the first cross section, an angle of the traveling direction of first light beam L1 relative to central axis CA between incidence surface 320 and emission surface 330; and $\theta3a$ is, in the first cross section, an angle of the traveling direction of first light beam L1 relative to central axis CA between emission surface 330 and the surface to be irradiated. That is, first reaching distance D1 is, in the first cross section, a distance in the direction orthogonal to central axis CA from central axis CA to first position to be irradiated P3a, on the surface to be irradiated, of light emitted at first light emitting angle θ1a calculated by a below-described method.

Figure 14A:
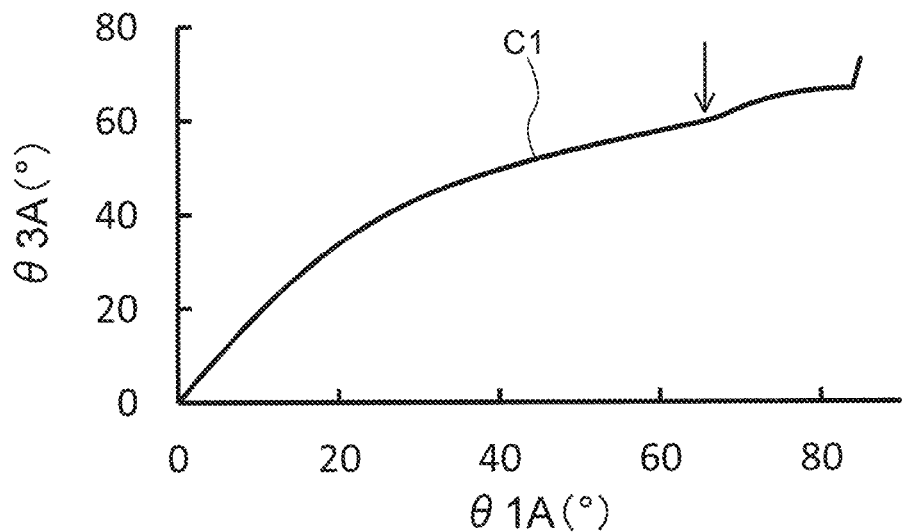
FIGS. 14A and 14B are graphs for describing determination of a first light emission angle.
Figure 14B:
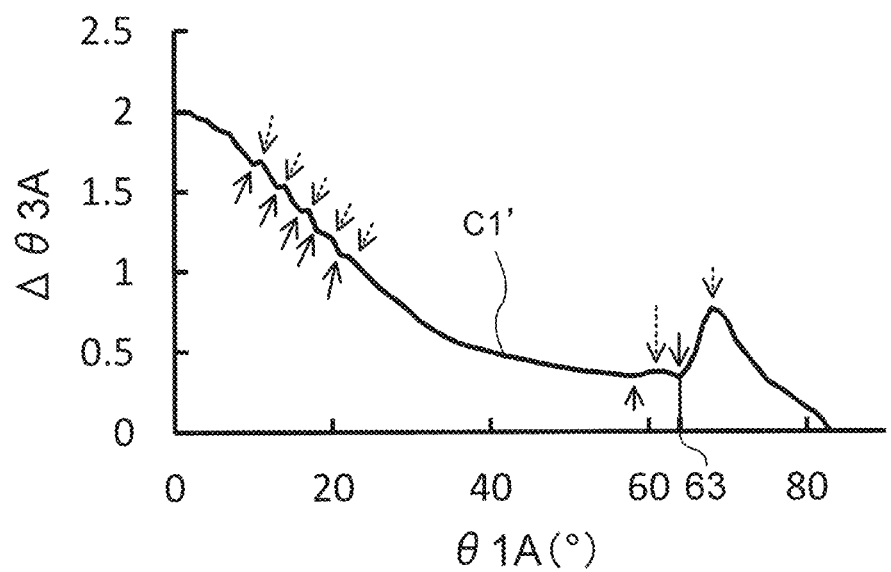

In the following, the determination of first light emission angle θ1a will be described. FIGS. 14A and 14B are graphs for describing determination of a first light emission angle θ1a. FIG. 14A is a graph which shows first polynomial approximation function C1 indicating the relation between light emission angle θ1A of a light beam emitted from the light emitting center of light emitting element 220, and light output angle θ3A of the light beam. FIG. 14B is a graph which shows first curve C1' corresponding to first-order differentiation of first polynomial approximation function C1. In FIG. 14A, the abscissa represents light emission angle θ1A (°), and the ordinate represents light emission angle θ3A (°). In FIG. 14B, the abscissa represents light emission angle θ1A (°), and the ordinate represents a first-order differential value of light emission angle θ3A (°).

First light emission angle θ1a is determined by the following method.

(1) In the first cross section which includes central axis CA, and a point closest to central axis CA and in the outer edge of emission surface 330, obtained is first polynomial approximation function C1 which indicates the relation between light emission angle θ1A that is an angle, relative to central axis CA, of the traveling direction of an arbitrary light beam emitted from light emitting center P0 between light emitting center P0 and incidence surface 320, and light output angle θ3A that is an angle of the traveling direction of the arbitrary light beam relative to central axis CA between emission surface 330 and the surface to be irradiated (refer to FIG. 14A).

(2) First curve C1' corresponding to first-order differentiation of the first polynomial approximation function is obtained (refer to FIG. 14B).

(3) Determined are one or more minimum points at which the inclination of a tangent of first curve C1' changes from negative to positive, and one or more maximum points at which the inclination of a tangent changes from positive to negative. In FIG. 14B, the minimum points are indicated by solid-line arrows, and the maximum points are indicated by broken-line arrows.

(4) For each of the one or more minimum points, identified is one maximum point, from the one or more maximum points, that has light emission angle θ1A larger than and closest to that of the minimum point, namely a maximum point on the immediately right of each minimum point in the graph of FIG. 14B.

(5) From the one or more minimum points, identified is one minimum point that exhibits the largest difference between differential values Δθ3A of light output angles θ3A thereof and of the corresponding maximum point. Light emission angle θ1A of the identified minimum point is determined as first light emission angle θ1a.

In the present embodiment, first light emission angle θ1a determined in the above manner is about 63° (refer to FIG. 14B).

First light emission angle θ1a determined in the above manner is an angle where the inclination changes significantly in first polynomial approximation function C1 illustrated in FIG. 14A (refer to solid-line arrow in FIG. 14A). In a region where light emission angle θ1 is smaller than first light emission angle θ1a, light emitted from emission surface 330 is controlled to become concentrated. In a region where light emission angle θ1 is larger than first light emission angle θ1a, meanwhile, light emitted from emission surface 330 is controlled to become expanded. In the first cross section, consequently, the reaching position of light emitted at first light emission angle θ1a in a region to be irradiated is a boundary between a bright part and a dark part.

In the following, the determination of second reaching distance D2 will be described. Second reaching distance D2 is determined by the following formula (4).

$$D2 = h1b \tan\theta1b + h2 \tan\theta2b + h3b \tan\theta3b \quad \text{Formula (4)}$$

As illustrated in FIG. 13B, in the above formula (4), $h1b$ is a distance in the second cross section from light emitting center P0 to second incidence position P1b that is an incidence point of second light beam L2 on the incidence surface, in the direction along central axis CA; $h2b$ is a distance in the second cross section from second incidence position P1$b$ to second emission position P2$b$ that is an emission point of second light beam L2 on emission surface 330, in the direction along central axis CA; and h3$b$ is a distance in the second cross section from second emission position P2$b$ to second position to be irradiated P3$b$ that is a reaching point of second light beam L2 on the surface to be irradiated, in the direction along central axis CA. In the formula, θ1$b$ is, in the second cross section, second light emission angle that is an angle of the traveling direction of second light beam L2 relative to central axis CA between light emitting center P0 and incidence surface 320; θ2$b$ is, in the second cross section, an angle of the traveling direction of second light beam L2 relative to the central axis between incidence surface 320 and emission surface 330; and θ3$b$ is an angle of the traveling direction of second light beam L2 relative to the central axis between emission surface 330 and the surface to be irradiated. That is, second reaching distance D2 is, in the second cross section, a distance in the direction orthogonal to central axis CA from central axis CA to second position to be irradiated P3$b$, on the surface to be irradiated, of light emitted at second light emitting angle θ1$b$ calculated by a below-described method.

Figure 15A:
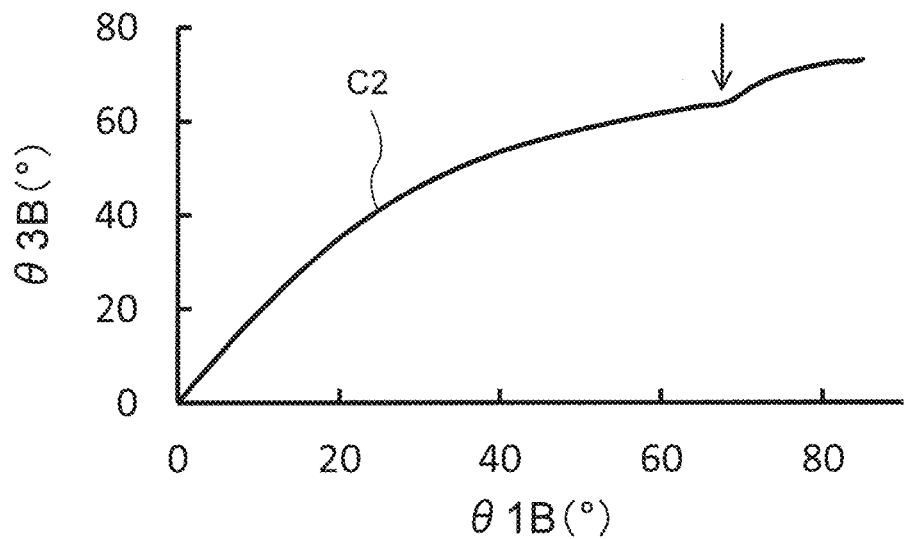
FIGS. 15A and 15B are graphs for describing determination of a second light emission angle.
Figure 15B:
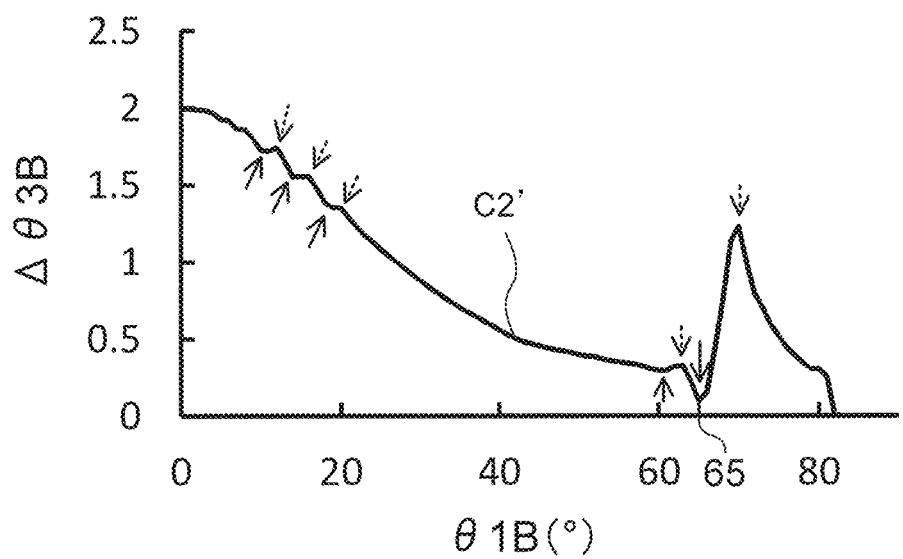

In the following, the determination of second light emitting angle θ1$b$ will be described. FIGS. 15A and 15B are graphs for describing determination of a second light emission angle θ1$b$. FIG. 15A is a graph which shows second polynomial approximation function C2 indicating the relation between light emission angle θ1B of a light beam emitted from the light emitting center of light emitting element 220, and light output angle θ3B of the light beam. FIG. 15B is a graph which shows second curve C2' corresponding to first-order differentiation of second polynomial approximation function C2. In FIG. 15A, the abscissa represents light emission angle θ1B (°), and the ordinate represents light emission angle θ3B (°). In FIG. 15B, the abscissa represents light emission angle θ1B (°), and the ordinate represents a first-order differential value of light emission angle θ3B (°).

Second light emission angle θ1$b$ is determined by the following method.

(1) In the second cross section which includes central axis CA, and a point farthest from central axis CA and in the outer edge of emission surface 330, obtained is a second polynomial approximation function which indicates the relation between light emission angle θ1B that is an angle, relative to central axis CA, of the traveling direction of an arbitrary light beam emitted from light emitting center P0 between light emitting center P0 and incidence surface 320, and light output angle θ3B that is an angle of the traveling direction of the arbitrary light beam relative to the central axis between emission surface 330 and the surface to be irradiated.

(2) Second curve C2' corresponding to first-order differentiation of the second polynomial approximation function is obtained (refer to FIG. 15B).

(3) Determined are one or more minimum points at which the inclination of a tangent of second curve C2' changes from negative to positive, and one or more maximum points at which the inclination of a tangent changes from positive to negative. In FIG. 15B, the minimum points are indicated by solid-line arrows, and the maximum points are indicated by broken-line arrows.

(4) For each of the one or more minimum points, identified is one maximum point, from the one or more maximum points, that has light emission angle θ1B larger than and closest to that of the minimum point, namely a maximum point on the immediate right of each minimum point in the graph of FIG. 15B.

(5) From the one or more minimum points, identified is one minimum point that exhibits the largest difference between differential values Δθ3B of light output angles θ3B thereof and of the corresponding maximum point. Light emission angle θ1B of the identified minimum point is determined as second light emission angle θ1$b$.

In the present embodiment, second light emission angle θ1$b$ determined in the above manner is about 65° (refer to FIG. 15B).

Second light emission angle θ1$b$ determined in the above manner is an angle where the inclination changes significantly in second polynomial approximation function C2 illustrated in FIG. 15A (refer to solid-line arrow in FIG. 15A). In a region where light emission angle θ1 is smaller than second light emission angle θ1$b$, light emitted from emission surface 330 is controlled to become concentrated. In a region where light emission angle θ1 is larger than second light emission angle θ1$b$, meanwhile, light emitted from emission surface 330 is controlled to become expanded. In the second cross section, consequently, the reaching position of light emitted at second light emission angle θ2$a$ in a region to be irradiated is a boundary between a bright part and a dark part.

The above formula (2) obtained on the basis of first light emission angle θ1$a$ and second light emission angle θ1$b$ determined in the above manner indicates that a substantially square region to be irradiated has four corners darker than the other parts thereof.

In the above example, second light emission angle θ1$b$ is larger than first light emission angle θ1$a$; however, for example, first light emission angle θ1$a$ may be larger than second light emission angle θ1$b$, or first light emission angle θ1$a$ and second light emission angle θ1$b$ may be substantially the same. Satisfying the above-described formulas (2) to (4) can obtain desired light distribution characteristics in any case.

(Measurement of Luminance of Surface Light Source Device)

Figure 16:
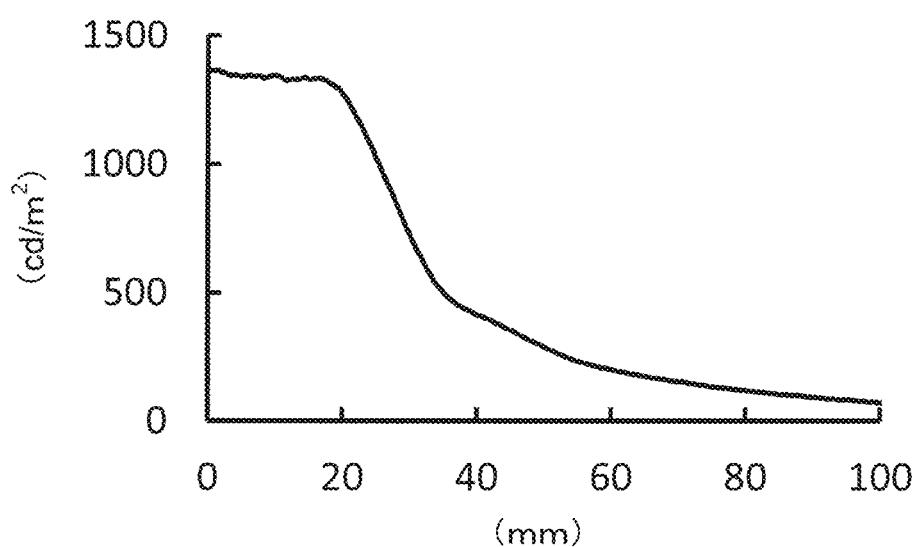
FIG. 16 is a graph showing luminance measurement results in the surface light source device.

The luminance distribution of surface light source device 100 including the above-described light flux controlling members 300 was measured. FIG. 16 is a graph showing luminance measurement results on the surface to be irradiated (light diffusing plate 120) of surface light source device 100. In FIG. 16, the abscissa represents a distance (mm) from the center of the surface to be irradiated (central axis CA) in the first cross section, and the ordinate represents luminance (cd/m$^2$). In the measurement, light diffusing plate 120 (surface to be irradiated) was disposed at a position 20 mm apart from substrate 210, and orthogonal to central axis CA; and a plurality of light emitting devices 200 was disposed in a square lattice shape, and only one light emitting device 200 was lit up.

Surface light source device 100 including light flux controlling members 300 according to the present embodiment, which satisfy the above-described formulas (2) to (4) as illustrated in FIG. 16, enabled suppression of the generation of a bright part on the surface to be irradiated (light diffusing plate 120), as described below.

(Simulation)

The luminance distribution was simulated for surface light source device 100 including the above-described light flux controlling members 300. In the simulation, a plurality of light emitting devices 200 was disposed in a lattice shape in surface light source device 100, and the plurality of light emitting devices 200 was lit up. As a comparison, simulation was also performed for a surface light source device including light flux controlling members for a rectangular surface to be irradiated (hereinafter also referred to as "surface light source device according to the comparative example"). The disposition of light emitting devices 200 in surface light source device 100 according to the present embodiment was the same as the disposition of light emitting devices in the surface light source device according to the comparative example.

Figure 17A:
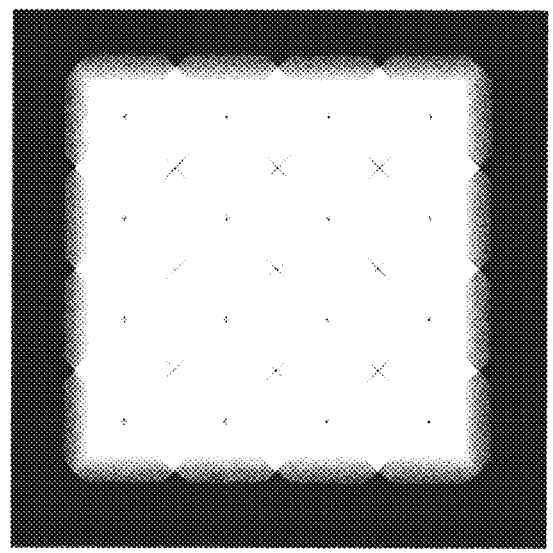
FIGS. 17A and 17B show simulation of luminance in surface light source devices.
Figure 17B:
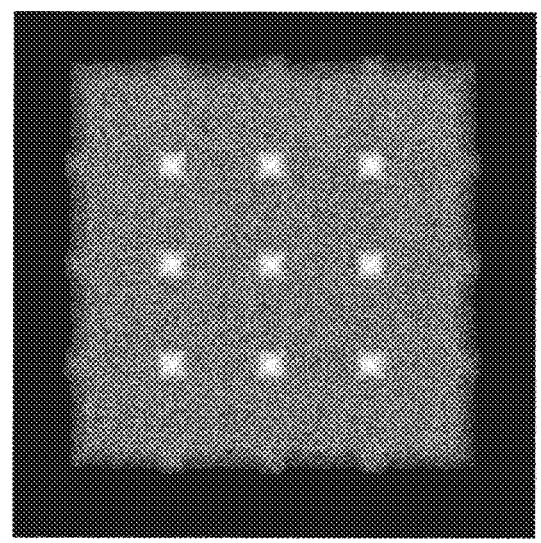

FIG. 17A shows simulation of luminance distribution in the surface light source device according to the present embodiment; and FIG. 17B shows simulation of luminance distribution in the surface light source device according to the comparative example.

As shown in FIG. 17A, it was suggested that, in surface light source device 100 according to the present embodiment, disposing a plurality of light emitting devices 200 in a square lattice shape (matrix shape) can suppress the generation of a bright part on the surface to be irradiated (light diffusing plate 120). The reason for the above advantageous effects can be deduced as follows. In the surface to be irradiated, a region to be irradiated with light from one light emitting device 200 has lower luminance in four corners than in other parts thereof, thereby reducing the possibility of the generation of a bright part even when a region to be irradiated by adjacent light emitting device 200 overlaps the above region to be irradiated.

As shown in FIG. 17B, for the surface light source device according to the comparative example, meanwhile, the regions to be irradiated are rectangular, and thus regions to be irradiated with light from light emitting devices overlapped each other at the four corners thereof to generate a bright part.

(Effects)

Since light flux controlling members 300 according to the present embodiment satisfy the above-described formulas (2) to (4), light flux controlling members 300 in a lattice shaped disposition are capable of suppressing the generation of a bright part on the surface to be irradiated. A light emitting device, a surface light source device and a display apparatus which include these light flux controlling members 300 are also capable of suppressing the generation of a bright part on the surface to be irradiated.

This application claims priority based on Japanese Patent Applications No. 2015-199452, filed on Oct. 7, 2015 and No. 2016-168310, filed on Aug. 30, 2016, the entire contents of which including the specifications and the drawings are incorporated herein by reference.

INDUSTRIAL APPLICABILITY

The light flux controlling member, light emitting device and surface light source device according to the present invention may be employed, for example, in a backlight of a liquid crystal display apparatus or a general lighting.

REFERENCE SIGNS LIST

10 Surface light source device
20 Printed wiring substrate
30 Light emitting device
35 Light emitting element
40 Light guide member
41 Lens
42 Flange
43 Recess
44 Incidence surface
45 Emission surface
46 Flat surface
47 Curved surface
100 Surface light source device
100' Display apparatus
107 Surface to be irradiated
110 Casing
112 Bottom plate
114 Top plate
120 Light diffusing plate
200 Light emitting device
210 Substrate
220 Light emitting element
300 Light flux controlling member
305 Rear surface
310 Recess
320 Incidence surface
330 Emission surface
330a First emission surface
330b Second emission surface
330c Overhanging part
411A, 411B Alleviation part
421A, 421B, 421C Leg
CA Central axis of light flux controlling member
OA Optical axis of light emitting element

What is claimed is:

1. A light flux controlling member configured to control a distribution of light emitted from a light emitting element, the light flux controlling member comprising:

an incidence surface which is an inner surface of a recess formed on a rear side of the light flux controlling member so as to intersect a central axis of the light flux controlling member; and an emission surface disposed on a side opposite to the incidence surface, wherein the emission surface includes a first emission surface protruding toward the rear side of the light flux controlling member, and a second emission surface protruding toward a front side of the light flux controlling member, the first emission surface being disposed so as to intersect the central axis of the light flux controlling member, and the second emission surface being disposed so as to surround the first emission surface;

wherein when the light emitting element is disposed so that a light emitting center thereof is positioned on the central axis and the light emitting element faces the recess, and when a surface to be irradiated is disposed above the emission surface so as to be orthogonal to the central axis, a second maximum value is larger than a first maximum value, wherein the first maximum value is determined by:

in a first cross section which includes the central axis of the light flux controlling member and a point closest to the central axis, the point closest to the central axis being in an outer edge of the emission surface, obtaining a first polynomial approximation function indicating a relation between a light emission angle θ1A and a light output angle θ3A, wherein the light emission angle θ1A is an angle, relative to the central axis, of a traveling direction of an arbitrary light beam between the light emitting center and the incidence surface, the arbitrary light beam being emitted from the light emitting center, and the light output angle θ3A is an angle of the traveling direction of the arbitrary light beam relative to the central axis between the emission surface and the surface to be irradiated, obtaining a first curve corresponding to first-order differentiation of the first polynomial approximation function, and determining the first maximum value which is a maximum value in the first curve in a case where the light emission angle θ1A is more than 40°; and wherein the second maximum value is determined by:

in a second cross section which includes the central axis of the light flux controlling member and a point farthest from the central axis, the point farthest from the central axis being in the outer edge of the emission surface, obtaining a second polynomial approximation function indicating a relation between a light emission angle θ1B and a light output angle θ3B, wherein the light emission angle θ1B is an angle, relative to the central axis, of a traveling direction of an arbitrary light beam between the light emitting center and the incidence surface, the arbitrary light beam being emitted from the light emitting center, and the light output angle θ3B is an angle of the traveling direction of the arbitrary light beam relative to the central axis between the emission surface and the surface to be irradiated, obtaining a second curve corresponding to first-order differentiation of the second polynomial approximation function, and determining the second maximum value which is a maximum value in the second curve in a case where the light emission angle θ1B is more than 40°.

2. A light emitting device comprising:
a light emitting element; and
the light flux controlling member according to claim 1.

3. A surface light source device comprising:
a plurality of the light emitting devices according to claim 2, the light emitting devices being disposed so that a plurality of the light emitting centers of a plurality of the light emitting elements are in a shape of a rectangular lattice; and
a light diffusing plate configured to transmit light emitted from the light emitting devices while diffusing the light, wherein formula (1) below is satisfied:

$$D1 < P < D2 \qquad \text{Formula (1)}$$

wherein D1 is half of a length of a long side of a unit lattice of the rectangular lattice, D2 is half of a length of a diagonal of the unit lattice of the rectangular lattice, and P is a distance from the central axis to an intersection of the light diffusing plate and a light beam emitted from the light emitting center of the light emitting element at the light emission angle θ1B corresponding to the second maximum value.

4. A display apparatus comprising:
the surface light source device according to claim 3; and
a member to be irradiated with light emitted from the surface light source device.

5. A light flux controlling member configured to control a distribution of light emitted from a light emitting element, the light flux controlling member comprising:
an incidence surface which is an inner surface of a recess formed on a rear side of the light flux controlling member so as to intersect a central axis of the light flux controlling member; and
an emission surface disposed on a side opposite to the incidence surface,
wherein the emission surface includes a first emission surface protruding toward the rear side of the light flux controlling member, and a second emission surface protruding toward a front side of the light flux controlling member, the first emission surface being disposed so as to intersect the central axis, and the second emission surface being disposed so as to surround the first emission surface; and wherein when the light emitting element is disposed so that a light emitting center thereof is positioned on the central axis and the light emitting element faces the recess, and when a surface to be irradiated is disposed above the emission surface so as to be orthogonal to the central axis, formula (2) below is satisfied:

$$D1 < D2 < D1 \times \sqrt{2} \qquad \text{Formula (2)}$$

wherein D1 is a first reaching distance determined by formula (3) below, the first reaching distance being, in a first cross section which includes the central axis and a point closest to the central axis, the point closest to the central axis being in an outer edge of the emission surface, a distance from the central axis to a first reaching point of a first light beam emitted from the light emitting center at a first light emission angle, the first reaching point being on the surface to be irradiated; and D2 is a second reaching distance determined by formula (4) below, the second reaching distance being, in a second cross section which includes the central axis and a point farthest from the central axis, the point farthest from the central axis being in the outer edge of the emission surface, a distance from the central axis to a second reaching point of a second light beam emitted from the light emitting center of the light emitting element at a second light emission angle, the second reaching point being on the surface to be irradiated;

$$D1 = h1a \tan\theta 1a + h2a \tan\theta 2a + h3a \tan\theta 3a \qquad \text{Formula (3)}$$

wherein h1a is a distance in the first cross section from the light emitting center to a first incidence position that is an incidence point of the first light beam on the incidence surface, the distance being in a direction along the central axis; h2a is a distance in the first cross section from the first incidence position to a first emission position that is an emission point of the first light beam on the emission surface, the distance being in the direction along the central axis; h3a is a distance in the first cross section from the first emission position to a first position to be irradiated that is the first reaching point of the first light beam on the surface to be irradiated, the distance being in the direction along the central axis; θ1a is the first light emission angle that is, in the first cross section, an angle of a traveling direction of the first light beam relative to the central axis between the light emitting center and the incidence surface; θ2a is, in the first cross section, an angle of the traveling direction of the first light beam relative to the central axis between the incidence surface and the emission surface; and θ3a is, in the first cross section, an angle of the traveling direction of the first light beam relative to the central axis between the emission surface and the surface to be irradiated, $$D2 = h1b \tan\theta 1b + h2b \tan\theta 2b + h3b \tan\theta 3b \qquad \text{Formula (4)}$$

wherein h1b is a distance in the second cross section from the light emitting center to a second incidence position that is an incidence point of the second light beam on the incidence surface, the distance being in the direction along the central axis; h2b is a distance in the second cross section from the second incidence position to a second emission position that is an emission point of the second light beam on the emission surface, the distance being in the direction along the central axis; h3b is a distance in the second cross section from the second emission position to a second position to be irradiated that is the second reaching point of the second light beam on the surface to be irradiated, the distance being in the direction along the central axis; θ1b is the second light emission angle that is, in the second cross section, an angle of a traveling direction of the second light beam relative to the central axis between the light emitting center and the incidence surface; θ2b is, in the second cross section, an angle of the traveling direction of the second light beam relative to the central axis between the incidence surface and the emission surface; and θ3b is, in the second cross section, an angle of the traveling direction of the second light beam relative to the central axis between the emission surface and the surface to be irradiated, wherein the first light emission angle θ1a is determined by:

in the first cross section, obtaining a first polynomial approximation function indicating a relation between a light emission angle θ1A and a light output angle θ3A, wherein the light emission angle θ1A is an angle, relative to the central axis, of a traveling direction of an arbitrary light beam between the light emitting center and the incidence surface, the arbitrary light beam being emitted from the light emitting center, and the light output angle θ3A is an angle of the traveling direction of the arbitrary light beam relative to the central axis between the emission surface and the surface to be irradiated, obtaining a first curve corresponding to first-order differentiation of the first polynomial approximation function, determining one or more minimum points at which an inclination of the first curve changes from negative to positive, and one or more maximum points at which the inclination of the first curve changes from positive to negative, for each of the one or more minimum points, identifying one corresponding maximum point whose light emission angle θ1A is larger than and closest to that of the minimum point, the maximum point being selected from the one or more maximum points, from the one or more minimum points, identifying one minimum point that exhibits a largest difference between differential values Δθ3A of the light output angles θ3A thereof and of the corresponding maximum point, and determining the light emission angle θ1A of the identified minimum point as the first light emission angle θ1a; and wherein the second light emission angle θ1b is determined by:

in the second cross section, obtaining a second polynomial approximation function indicating a relation between a light emission angle θ1B and a light output angle θ3B, wherein the light emission angle θ1B is an angle, relative to the central axis, of a traveling direction of an arbitrary light beam between the light emitting center and the incidence surface, the arbitrary light beam being emitted from the light emitting center, and the light output angle θ3B is an angle of the traveling direction of the arbitrary light beam relative to the central axis between the emission surface and the surface to be irradiated, obtaining a second curve corresponding to first-order differentiation of the second polynomial approximation function, determining one or more minimum points at which an inclination of the second curve changes from negative to positive, and one or more maximum points at which the inclination of the second curve changes from positive to negative, for each of the one or more minimum points, identifying one corresponding maximum point whose light emission angle θ1B is larger than and closest to that of the minimum point, the maximum point being selected from the one or more maximum points, and from the one or more minimum points, identifying one minimum point that exhibits a largest difference between differential values Δθ3B of the light output angles θ3B thereof and of the corresponding maximum point, and determining the light emission angle θ1B of the identified minimum point as the second light emission angle θ1b.

6. A light emitting device comprising:
a light emitting element; and
the light flux controlling member according to claim 5.

7. A surface light source device comprising:
the light emitting device according to claim 6; and
a light diffusing plate configured to transmit light emitted from the light emitting device while diffusing the light.

8. A display apparatus comprising:
the surface light source device according to claim 7; and
a member to be irradiated with light emitted from the surface light source device.

* * * * *